United States Patent
Bowering et al.

(10) Patent No.: US 7,193,228 B2
(45) Date of Patent: Mar. 20, 2007

(54) EUV LIGHT SOURCE OPTICAL ELEMENTS

(75) Inventors: Norbert R. Bowering, San Diego, CA (US); Alexander I. Ershov, San Diego, CA (US); Timothy S. Dyer, Auburn, CA (US); Hugh R. Grinolds, Fort Collins, CO (US)

(73) Assignee: Cymer, Inc., San Diego, CA (US)

( * ) Notice: Subject to any disclaimer, the term of this patent is extended or adjusted under 35 U.S.C. 154(b) by 16 days.

(21) Appl. No.: 11/021,261

(22) Filed: Dec. 22, 2004

(65) Prior Publication Data

US 2005/0199830 A1 Sep. 15, 2005

Related U.S. Application Data

(63) Continuation-in-part of application No. 10/979,945, filed on Nov. 1, 2004, and a continuation-in-part of application No. 10/900,839, filed on Jul. 27, 2004, and a continuation-in-part of application No. 10/803,526, filed on Mar. 17, 2004, now Pat. No. 7,087,914, and a continuation-in-part of application No. 10/798,740, filed on Mar. 10, 2004.

(51) Int. Cl.
*G01J 1/00* (2006.01)
*G02B 1/00* (2006.01)

(52) U.S. Cl. .............................. 250/504 R; 250/493.1; 378/34; 378/119; 438/95; 438/736; 359/357; 359/359; 359/360; 359/361

(58) Field of Classification Search ................ 250/400, 250/493.1, 504 R
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |

(Continued)

FOREIGN PATENT DOCUMENTS

JP 2000091096 A 3/2000

OTHER PUBLICATIONS

Shirashige et al., 2001 Electronic Components and Technology Conference.*

(Continued)

*Primary Examiner*—Nikita Wells
*Assistant Examiner*—Bernard Souw
(74) *Attorney, Agent, or Firm*—William C. Cray

(57) ABSTRACT

Apparatus and methods are disclosed for forming plasma generated EUV light source optical elements, e.g., reflectors comprising MLM stacks employing various binary layer materials and capping layer(s) including single and binary capping layers for utilization in plasma generated EUV light source chambers, particularly where the plasma source material is reactive with one or more of the MLM materials.

74 Claims, 7 Drawing Sheets

U.S. PATENT DOCUMENTS

| | | | | |
|---|---|---|---|---|
| 3,746,870 | A | 7/1973 | Demarest | 250/227 |
| 3,960,473 | A | 6/1976 | Harris | 425/467 |
| 3,961,197 | A | 6/1976 | Dawson | 250/493 |
| 3,969,628 | A | 7/1976 | Roberts et al. | 250/402 |
| 4,042,848 | A | 8/1977 | Lee | 313/231.6 |
| 4,088,966 | A | 5/1978 | Samis | 313/231.5 |
| 4,143,275 | A | 3/1979 | Mallozzi et al. | 250/503 |
| 4,162,160 | A | 7/1979 | Witter | 75/246 |
| 4,203,393 | A | 5/1980 | Giardini | 123/30 |
| 4,364,342 | A | 12/1982 | Asik | 123/143 |
| 4,369,758 | A | 1/1983 | Endo | 123/620 |
| 4,460,417 | A * | 7/1984 | Murase et al. | 438/365 |
| 4,504,964 | A | 3/1985 | Cartz et al. | 378/119 |
| 4,507,588 | A | 3/1985 | Asmussen et al. | 315/39 |
| 4,536,884 | A | 8/1985 | Weiss et al. | 378/119 |
| 4,538,291 | A | 8/1985 | Iwamatsu | 378/119 |
| 4,561,406 | A | 12/1985 | Ward | 123/536 |
| 4,596,030 | A | 6/1986 | Herziger et al. | 378/119 |
| 4,618,971 | A | 10/1986 | Weiss et al. | 378/34 |
| 4,626,193 | A | 12/1986 | Gann | 431/71 |
| 4,633,492 | A | 12/1986 | Weiss et al. | 378/119 |
| 4,635,282 | A | 1/1987 | Okada et al. | 378/34 |
| 4,751,723 | A | 6/1988 | Gupta et al. | 378/119 |
| 4,752,946 | A | 6/1988 | Gupta et al. | 378/119 |
| 4,774,914 | A | 10/1988 | Ward | 123/162 |
| 4,837,794 | A | 6/1989 | Riordan et al. | 378/119 |
| 4,914,500 | A * | 4/1990 | Liu et al. | 257/384 |
| 4,928,020 | A | 5/1990 | Birx et al. | 307/106 |
| 5,023,897 | A | 6/1991 | Neff et al. | 378/122 |
| 5,027,076 | A | 6/1991 | Horsley et al. | 324/674 |
| 5,102,776 | A | 4/1992 | Hammer et al. | 430/311 |
| 5,126,638 | A | 6/1992 | Dethlefsen | 315/326 |
| 5,142,166 | A | 8/1992 | Birx | 307/419 |
| 5,171,360 | A | 12/1992 | Orme et al. | 75/331 |
| 5,175,755 | A | 12/1992 | Kumakhov | 378/34 |
| 5,226,948 | A | 7/1993 | Orme et al. | 75/331 |
| 5,259,593 | A | 11/1993 | Orme et al. | 266/78 |
| 5,313,481 | A | 5/1994 | Cook et al. | 372/37 |
| 5,319,695 | A | 6/1994 | Itoh et al. | 378/84 |
| 5,340,090 | A | 8/1994 | Orme et al. | 266/202 |
| RE34,806 | E | 12/1994 | Cann | 427/446 |
| 5,411,224 | A | 5/1995 | Dearman et al. | 244/53 |
| 5,448,580 | A | 9/1995 | Birx et al. | 372/38 |
| 5,504,795 | A | 4/1996 | McGeoch | 378/119 |
| 5,709,745 | A * | 1/1998 | Larkin et al. | 117/96 |
| 5,729,562 | A | 3/1998 | Birx et al. | 372/38 |
| 5,763,930 | A | 6/1998 | Partlo | 250/504 |
| 5,861,321 | A * | 1/1999 | Tregilgas et al. | 438/95 |
| 5,866,871 | A | 2/1999 | Birx | 219/121 |
| 5,894,980 | A | 4/1999 | Orme-Marmarelis et al. | 228/33 |
| 5,894,985 | A | 4/1999 | Orme-Marmarelis et al. | 228/262 |
| 5,936,988 | A | 8/1999 | Partlo et al. | 372/38 |
| 5,938,102 | A | 8/1999 | Muntz et al. | 228/102 |
| 5,963,616 | A | 10/1999 | Silfvast et al. | 378/122 |
| 5,970,076 | A | 10/1999 | Hamada | 372/20 |
| 6,031,241 | A * | 2/2000 | Silfvast et al. | 250/504 R |
| 6,031,598 | A | 2/2000 | Tichenor et al. | 355/67 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,172,324 | B1 | 1/2001 | Birx | 219/121.57 |
| 6,186,192 | B1 | 2/2001 | Orme-Marmarelis et al. | 141/18 |
| 6,195,272 | B1 | 2/2001 | Pascente | 363/21 |
| 6,224,180 | B1 | 5/2001 | Pham-Van-Diep et al. | 347/2 |
| 6,228,512 | B1 * | 5/2001 | Bajt et al. | 428/635 |
| 6,264,090 | B1 | 7/2001 | Muntz et al. | 228/33 |
| 6,276,589 | B1 | 8/2001 | Watts, Jr. et al. | 228/33 |
| 6,285,743 | B1 | 9/2001 | Kondo et al. | 378/119 |
| 6,307,913 | B1 | 10/2001 | Foster et al. | 378/34 |
| 6,317,448 | B1 | 11/2001 | Das et al. | 372/32 |
| 6,377,651 | B1 | 4/2002 | Richardson et al. | 378/34 |
| 6,396,900 | B1 | 5/2002 | Barbee, Jr. et al. | 378/84 |
| 6,449,086 | B1 * | 9/2002 | Singh | 359/361 |
| 6,452,194 | B2 | 9/2002 | Bijkerk et al. | 250/492.2 |
| 6,452,199 | B1 | 9/2002 | Partlo et al. | 250/504 |
| 6,491,737 | B2 | 12/2002 | Orme-Marmerelis et al. | 75/335 |
| 6,493,423 | B1 | 12/2002 | Bisschops | 378/119 |
| 6,520,402 | B2 | 2/2003 | Orme-Marmerelis et al. | 228/260 |
| 6,522,716 | B1 * | 2/2003 | Murakami et al. | 378/34 |
| 6,562,099 | B2 | 5/2003 | Orme-Marmerelis et al. | 75/335 |
| 6,566,667 | B1 | 5/2003 | Partlo et al. | 250/504 |
| 6,566,668 | B2 | 5/2003 | Rauch et al. | 250/504 |
| 6,576,912 | B2 | 6/2003 | Visser et al. | 250/492.2 |
| 6,580,517 | B2 | 6/2003 | Lokai et al. | 356/519 |
| 6,583,068 | B2 * | 6/2003 | Yan et al. | 430/5 |
| 6,586,757 | B2 | 7/2003 | Melnychuk et al. | 250/504 |
| 6,590,959 | B2 | 7/2003 | Kandaka et al. | 378/119 |
| 6,624,441 | B2 * | 9/2003 | Cantwell et al. | 257/43 |
| 6,647,086 | B2 | 11/2003 | Amemiya et al. | 378/34 |
| 6,656,575 | B2 | 12/2003 | Bijkerk et al. | 428/212 |
| 6,724,462 | B1 | 4/2004 | Singh et al. | 355/53 |
| 6,744,060 | B2 | 6/2004 | Ness et al. | 315/111.01 |
| 6,780,496 | B2 | 8/2004 | Bajt et al. | 425/216 |
| 6,804,327 | B2 * | 10/2004 | Schriever et al. | 378/119 |
| 6,815,700 | B2 | 11/2004 | Melnychuk et al. | 250/504 |
| 6,855,984 | B1 * | 2/2005 | Wu et al. | 257/335 |
| 6,865,255 | B2 | 3/2005 | Richardson | 378/119 |
| 6,867,420 | B2 * | 3/2005 | Mathies et al. | 250/458.1 |
| 6,897,140 | B2 * | 5/2005 | Drouin et al. | 438/607 |
| 2001/0055364 | A1 * | 12/2001 | Kandaka et al. | 378/119 |
| 2003/0068012 | A1 | 4/2003 | Ahmad et al. | 378/119 |
| 2003/0196512 | A1 | 10/2003 | Wyszomierski et al. | 75/336 |
| 2003/0219056 | A1 | 11/2003 | Yager et al. | 372/57 |
| 2004/0009410 | A1 * | 1/2004 | Lercel et al. | 430/5 |
| 2004/0063004 | A1 * | 4/2004 | Alkemper et al. | 430/5 |
| 2004/0091789 | A1 * | 5/2004 | Han et al. | 430/5 |
| 2004/0184019 | A1 * | 9/2004 | Totzeck et al. | 355/71 |
| 2004/0192063 | A1 * | 9/2004 | Koike | 438/736 |
| 2004/0192171 | A1 * | 9/2004 | Koike | 451/5 |
| 2005/0199830 | A1 * | 9/2005 | Bowering et al. | 250/504 R |

OTHER PUBLICATIONS

NITON "XRF Detectors", Mar. 23, 2003.<http://www.ccsservices.ru/Meanalysis/PinCCS.pdf>.*

NIOBIUM, May 24, 2000 <http://www.scescape.net/~woods/elements/niobium.html>.*

Andreev, et al., "Enhancement of laser/EUV conversion by shaped laser pulse interacting with Li-contained targets for EUV lithography", *Proc. of SPIE*, 5196:128-136, (2004).

Apruzese, J.P., "X-Ray Laser Research Using Z Pinches,", *Am. Inst. of Phys.* 399-403, (1994).

Bal et al., "Optimizing multiplayer coatings for Extreme UV projection systems," Faculty of Applied Sciences, Delft University of Technology.

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 66(4):401-406, (1998).

Braun, et al., "Multi-component EUV Multilayer Mirrors," *Proc. SPIE*, 5037:2-13, (2003).

Choi, et al., "A$10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Choi et al., Temporal development of hard and soft x-ray emission from gas-puff Z pinch, *Rev. Sci. Instrum.* 57(8), pp. 2162-2164 (Aug. 1986).

Eckhardt, et al., "Influence of doping on the bulk diffusion of Li into Si(100)," *Surface Science* 319 (1994) 219-223.

Eichler, et al., "Phase conjugation for realizing lasers with diffraction limited beam quality and high average power," Techinische Universitat Berlin, Optisches Institut, (Jun. 1998).

Fedosejevs et al., "Subnanosecond pulses from a KrF Laser pumped $SF_6$ Brillouin Amplifier", *IEEE J. QE* 21, 1558-1562 (1985).

Feigl, et al., "Heat Resistance of EUV Multilayer Mirrors for Long-time Applications," *Microelectric Engineering*, 57-58:3-8, (2001).

Fomenkov, et al., "Characterization of a 13.5nm Source for EUV Lithography based on a Dense Plasma Focus and Lithium Emission," Sematech Intl. Workshop on EUV Lithography (Oct. 1999).

Giordano et al., "Magnetic pulse compressor for prepulse discharge in spiker-sustainer excitati technique for XeCl lasers," *Rev. Sci. Instrum* 65(8), pp. 2475-2481 (Aug. 1994).

Hansson, et al., "Xenon liquid jet laser-plasma source for EUV lithography," Emerging Lithographic Technologies IV, *Proc. of SPIE*, vol. 3997:729-732 (2000).

Jahn, Physics of Electric Propulsion, McGraw-Hill Book Company, (Series in Missile and Space U.S.A.), Chap. 9, "Unsteady Electromagnetic Acceleration," p. 257 (1968).

Jiang, et al., "Compact multimode pumped erbium-doped phosphate fiber amplifiers," *Optical Engineering*, vol. 42, Issue 10, pp. 2817-2820 (Oct. 2003).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

Kjornrattanawanich, Ph.D. Dissertation, U.S. Department of Energy, Lawrence Livermore National Laboratory, Sep. 1, 2002.

Kloidt et al., "Enhancement of the reflectivity of Mo/Si multilayer x-ray mirrors by thermal treatment," *Appl. Phys. Lett.* 58(23), 2601-2603 (1991).

Kuwahara et al., "Short-pulse generation by saturated KrF laser amplification of a steep Stokes pulse produced by two-step stimulated Brillouin scattering", *J. Opt. Soc. Am.* B 17, 1943-1947 (2000).

Lange, Michael R., et al., "High gain coefficient phosphate glass fiber amplifier," NFOEC 2003, paper No. 126.

Lebert, et al., "Soft x-ray emission of laser-produced plasmas using a low-debris cryogenic nitrogen target," *J. App. Phys.*, 84(6):3419-3421 (1998).

Lebert, et al., "A gas discharged based radiation source for EUV-lithography," Intl. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser. No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocycloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Lowe, "Gas plasmas yield X-rays for Lithography," *Electronics*, pp. 40-41 (Jan. 27, 1982).

Malmquist, et al., "Liquid-jet target for laser-plasma soft x-ray generation," *Am. Inst. Phys.* 67(12):4150-4153 (1996).

Mather, "Formation of a High-Density Deuterium Plasma Focus," *Physics of Fluids*, 8(2), 366-377 (Feb. 1965).

Mather, et al., "Stability of the Dense Plasma Focus," *Phys. Of Fluids*, 12(11):2343-2347 (1969).

Matthews and Cooper, "Plasma sources for x-ray lithography," *SPIE*, vol. 333 *Submicron Lithography*, pp. 136-139 (1982).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Montcalm et al., "Mo/Y multiplayer mirrors for the 8-12-nm wavelength region," *Optics Letters*, 19(15): 1173-1175 (Aug. 1, 1994).

Montcalm et al., "*In situ* reflectance measurements of soft-s-ray/extreme-ultraviolet Mo/Y multiplayer mirrors," *Optics Letters* 20(12): 1450-1452 (Jun. 15, 1995).

Nilsen et al., "Mo:Y multiplayer mirror technology utilized to image the near-field output of a Ni-like Sn laser at 11.9 nm," *Optics Letters*, 28(22) 2249-2251 (Nov. 15, 2003).

Nilsen, et al., "Analysis of resonantly photopumped Na-Ne x-ray-laser scheme," *Am Phys. Soc.* 44(7):4591-4597 (1991).

H. Nishioka et al., "UV saturable absorber for short-pulse KrF laser systems", *Opt. Lett.* 14, 692-694 (1989).

Orme, et al., "Electrostatic charging and deflection of nonconventional droplet streams formed from capillary stream breakup," *Physics of Fluids*, 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," *Physica Sripta*, T75:104-111, (1998).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Pearlman et al., "X-ray lithography using a pulsed source," *J. Vac. Sci. Technol.*, pp. 1190-1193 (Nov./Dec. 1981).

Pint et al., "High temperature compatibility issues for fusion-reactor structural materials," Metals and Ceramics Divisionm Oak Ridge National Laboratory, P.O. Box 2008, Oak Ridge, TN 37831-6156.

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch photopumped by Al XI line radiation at 48.338 Å," *The Am. Phys. Soc.*, 47(3):2253-2263 (Mar. 1993).

Sae-Lao et al., "Performance of normal-incidence molybdenum-yttrium multilayer-coated diffraction grating at a wavelength of 9 nm," *Applied Optics*, 41(13): 2394-1400 (May 1, 2002).

Sae-Lao et al., "Molybdenum-strontium multiplayer mirrors for the 8-12-nm extreme-ultraviolet wavelength region," *Optics Letters*, 26(7):468-470, (Apr. 1, 2001).

Sae-Lao et al., "Normal-incidence multiplayer mirrors for the 8-12 nm wavelength region," Information Science and Technology, Lawrence Livermore National Laboratory.

Sae-Lao et al., "Measurements of the refractive index of ytrrium in the 50-1300-eV energy region," *Applied Optics*, 41(34):7309-7316 (Dec. 1, 2002).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

S. Schiemann et al., "Efficient temporal compression of coherent nanosecond pulses in a compact SBS generator-amplifier setup", *IEEE J. OE* 33, 358-366 (1997).

Schriever, et al., "Laser-produced lithium plasma as a narrow-band extended ultraviolet radiation source for photoelectron spectroscopy," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571 (May 1998).

Sharafat et al., Coolant Structural Materials Compatibility, Joint APEX Electronic Meeting, UCLA, (Mar. 24, 2000).

Shiloh et al., "Z Pinch of a Gas Jet," *Physical Review Lett.*, 40(8), pp. 515-518 (Feb. 20, 1978).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 nanometers," *Laser Focus World*, p. 13. (Mar. 1997).

Singh et al., "Improved Theorectical Reflectivities of Extreme Ultraviolet Mirrors," Optics Research Group, Faculty of Applied Sciences, Delft University of Technology.

Singh et al., "Design of multiplayer extreme-ultraviolet mirrors for enhanced reflectivity," *Applied Optics*, 39(13):2189-2197 (May 1, 2000).

Soufli, et al., "Absolute photoabsorption measurements of molybdenum in the range of 60-930 eV for optical constant determination," *Applied Optics* 37(10): 1713-1719 (Apr. 1, 1998).

Srivastava et al., "High-temperature studies on Mo-Si multilayers using transmission electron microscope," *Current Science*, 83 (8):997-1000 (Oct. 25, 2002).

Stallings et al., "Imploding argon plasma experiments," *Appl. Phys. Lett.*, 35(7), pp. 524-526 (Oct. 1, 1979).

Takahashi, E., et al., "KrF laser picosecond pulse source by stimulated scattering processes", *Opt. Commun.* 215, 163-167 (2003).

Takahashi, E., et al., "High-intensity short KrF laser-pulse generation by saturated amplification of truncated leading-edge pulse", *Opt. Commun.* 185, 431-437 (2000).

Takenaka, et al., "Heat resistance of MoSi, $Mo/Si_2/Si$, and $Mo_5Si_3/Si$ multiplayer soft x-ray mirrors," *J. Appl. Phys.* 78(9) 5227-5230 (Nov. 1, 1995).

Tillack, et al., "Magnetic Confinement of an Expanding Laser-Produced Plasma", UC San Diego, Center for Energy Research, UCSD Report & Abramova—Tornado Trap.

Wilhein, et al., "A slit grating spectrograph for quantitative soft x-ray spectroscopy," *Am. Inst. Of Phys. Rev. of Sci. Instrum.*, 70(3):1694-1699, (Mar. 1999).

Wu, et al., "The vaccum Spark and Spherical Pinch X-ray/EUV Point Sources," *SPIE, Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

* cited by examiner

US 7,193,228 B2

EUV LIGHT SOURCE OPTICAL ELEMENTS

RELATED APPLICATIONS

The present application is a continuation-in-part of U.S. patent application Ser. No. 10/979,945, entitled LPP EUV LIGHT SOURCE, filed on Nov. 1, 2004, and Ser. No. 10/900,839, entitled EUV LIGHT SOURCE, filed on Jul. 27, 2004, and Ser. No. 10/803,526, entitled HIGH REPETITION RATE LPP EUV LIGHT SOURCE, filed on Mar. 17, 2004 now U.S. Pat. No. 7,087,914, and Ser. No. 10/798,740, entitled COLLECTOR FOR EUV LIGHT, filed on Mar. 10, 2004, the disclosures of each of which is incorporated by reference.

FIELD OF THE INVENTION

The present invention relates to extreme ultraviolet ("EUV") light generators providing EUV light from a plasma created from a source material and collected and directed to a focus for utilization outside of the EUV light source generation chamber, e.g., for semiconductor integrated circuit manufacturing photolithography process performing machines, e.g., at wavelengths of around 20 nm and below.

BACKGROUND OF THE INVENTION

It is known that for extreme ultraviolet ("EUV") light, e.g., at wavelengths of around 20 nm or less, sometimes also referred to a soft-xrays, e.g., at 13.5 nm, reflective optical elements will be needed, e.g., for collecting and focusing the EUV light generated from a plasma created from a source material. At the wavelengths involved, either grazing angle of incidence or multi-layer mirror ("MLM") so called normal angle of incidence reflectors will be necessary for the collection and focusing of the light emitted from the plasma, whether an electric discharge produced plasma ("DPP") produced by an electrical discharge between a pair of electrodes or a laser produced plasma ("LPP") produced by a focused laser beam irradiating a target material to produce the plasma.

In the process of the creation of the plasma for the emission of EUV light several harsh results of the plasma creation are released into the environment in the EUV light source generation chamber around the plasma that are potentially very damaging to materials comprising, e.g., the collector/director optical element, e.g., heat, high energy ions and scattered debris from the plasma formation, e.g., atoms or clumps of source material not ionized in the plasma formation process. The heat, high energy ions and/or source material may be damaging to the optical elements in a number of ways, including simply heating them, penetrating into them and, e.g., damaging structural integrity and/or optical properties, e.g., the mechanics of MLM operation to reflect light at such short wavelengths, corroding or eroding them and/or diffusing into them. The source materials may be particularly reactive, e.g., with a material making up at least one layer of the MLM, e.g., lithium and silicon, so that steps may need to be taken to reduce the potential effects of the reactivity, especially at elevated temperatures, and/or keep the materials separated, e.g., either by capping layers or by intermediate diffusion barrier layers or both. Temperature stability, ion-implantation and diffusion problems may need to be addressed even with less reactive source materials, e.g., tin, or indium or xenon.

In addition, the nature of debris management for the EUV light source chamber may result in increasing the harshness of the environment in which the MLM stack and its protective overcoating (capping) layer(s) need to operate and protect the underlying binary multilayer stack. This needs to be done without detracting significantly from overall reflectivity at the same time. Technique employed may be, e.g., heating the reflector to elevated temperatures of, e.g., over 500° C., e.g., to evaporate debris from the reflector surfaces and/or utilizing an etchant, e.g., a halogen etchant to etch debris from the reflector surfaces and/or creating a shielding plasma in the vicinity of the reflector surfaces, as discussed further in the above referenced co-pending patent application.

Applicants propose a variety of MLM arrangements and materials useful in optimizing the reflectivity of the optical elements to incident EUV light and the lifetime of the optical elements in the harsh environment, where, by way of example some 16 to 48 thousand plasma formations may occur per second of operation of the plasma generated EUV light source in close proximity to the collector/director and other optical elements in a light source chamber in which the optical elements must remain for months if not a year or more at a time, due to the difficulties engendered by breaking the seal of the light source chamber to replace optical elements and due to the expense of replacement of such optical elements.

Some have discussed lithium compatibilities with other materials and lithium diffusion, but not in the context of MLM and particularly not in the context of providing a suitable collector/director for an EUV light source with a reactive plasma source materials and specifically not in the context of a lithium plasma source material. M. Eckhardt, et al. "Influence of doping on the bulk diffusion of Li into Si(100)", Surf. Sci. 319, 219–223 (1994) discusses the influence of doping on bulk diffusion of Li into a Si crystal. The article describes the influence of doping on the bulk diffusion of Li into Si(100). They state that for an n-type doped Si(100) surface there is no lithium diffusion into the bulk at temperatures below 1000 K (=730° C.). Applicants propose to apply this principle to the provision of suitable EUV optical reflecting elements where the source material for the plasma is a reactive element, e.g., lithium.

Yttria has been used by the fusion community to protect the first reactor wall from the hot lithium by means of a coating. Also work on Mo/Y multilayers has been done by Livermore Laboratories National Laboratories ("LLNL") for reflection in the wavelength range of 7–12 nm. However applicants are not aware of use of yttrium for collector/director or other optics in a plasma generated EUV light source for protection of the optics, e.g., from a reactive source material, e.g., lithium.

Also see Compatibility of insulating ceramic materials with liquid breeders, Mitsuyama et al., Fusion Eng. Des. 39–40, 811(1998), Pint et al., "High temperature compatibility issues for fusion reactor structural materials", Fusion Sci. Technol. 44, 433–440 (2003); Sarafat, et al., "Coolant structural materials compatibility," Report, Apex meeting, Mar. 24, 2000; Kloidt et al, Appl. Phys. Lett. 58 (23), 2601–2603 (1991)

Others have discussed MLM materials and properties, but not in the context of plasma generated EUV light sources and also not reactive source materials, and particularly not in the context of the use of lithium as a plasma source material. Several patents and articles have discussed MLM materials and capping layers, but not in the context of the requirements for a plasma generated EUV collector/director and other EUV source chamber optics, e.g., temperature stability requirements at relatively elevated temperatures, and also not in the context of a reactive EUV plasma material and particularly lithium. Mo/Y MLMs without barrier layers have been shown to be thermally stable to 250° C. by Bajt et al., LLNL group, e.g., in Bajt, et al., "Mo:Y multilayer mirror technology utilized to image the near-field output of a Ni-like sn laser at 11.9 nm", Optics Letters, Vol. 28, No. 22 (Nov. 15, 2003 p. 2249, and Kjornrattanawanich, "Reflectance, optical properties and stability of molybdenum/strontium and molybdenum/yttrium multilayer mirrors, Ph. D. Dissertation (University of California Davis, Report UCRL-LR-150541 (2002). If yttrium layers have just the right very small amount of oxygen or if they are essentially oxygen-free then Mo/Y multilayer may be stable also at temperatures above 250° C., as indicated by the referenced Kjornrattanawanich Disertation, where it was observed that there is a higher contrast for Mo/Y multilayers in cross-sectional transmission-electron microscope pictures after heating (annealing) of the Mo/Y mirrors. U.S. Pat. No. 6,724,462, issued to Singh, et al. on Apr. 20, 2004, entitled CAPPING LAYER FOR EUV OPTICAL ELEMENTS, discusses EUV reflectors for lithography tool environments not subject to the rigors of the environment within a plasma produced EUV light source that must be accounted for in selecting appropriate materials for the reflectors, including, e.g., the choice between grazing angle or incidence reflecting layers and multilayer mirrors for more normal angle of incidence, the shape and proximity of reflector surfaces to the plasma, the plasma source material, debris mitigation steps taken, e.g., elevated temperatures for debris evaporation, halogen debris etching, debris diffusion, etc. Rather the materials selected by the '462 patent and others are based almost exclusive on maximizing reflectivity in a relatively sterile and pristine environment of a lithography tool utilizing EUV light for photoresist exposure, where, e.g., the capping layer is selected to be "relatively inert" to the surrounding environment, e.g., exposure to air. To similar effect is U.S. Pat. No. 6,656,575, issued to Bijkerk, et al. on Dec. 2, 2003, MULTILAYER SYSTEM WITH PROTECTING LAYER SYSTEM AND PRODUCTION METHOD, relating also to a lithography tool environment for EUV reflectors. U.S. Pat. No. 6,449,086, issued to Singh on Sep. 10, 2002, entitled MULTILAYER EXTREME ULTRAVIOLET MIRRORS WITH ENHANCED REFLECTIVITY is to the same effect relating to intermediate layer materials and a capping layer of "relatively inert material." U.S. Pat. No. 6,228,512, issued to Bajt et al. on May 8, 2001, entitled MORU/BE MULTILAYERS FOR EXTREME ULTRAVIOLET APPLICATIONS, relating to MoRu/Be MLM binary layers and roughness reducing and intermixing intermediate layers and oxide capping layers for systems potentially exposed to water vapor. U.S. Pat. No. 6,780,496, issued to Bajt, et al. on Aug. 24, 2004, entitled, OPTIMIZED CAPPING LAYERS FOR EUV MULTILAYERS including a binary capping layer with Ru and an undercoating to prevent Ru diffusion into the underlying binary layers and Ru selected for resistance to oxidation in, e.g., a lithography tool environment.

Takenaka et al., "Heat resistance of Mo/Si, $MoSi_2$/Si and $Mo_5Si_3$/Si multilayer soft x-ray mirrors", J. Appl. Phys. 78, 5227 (1995) discusses the combination $Mo_5Si_3$/Si, but not the combination Si—$MoSi_2$—$Mo_5Si_3$—$MoSi_2$ proposed by applicants.

SUMMARY OF THE INVENTION

Apparatus and methods are disclosed for forming DPP or LPP plasma generated EUV light source optical elements, e.g., reflectors comprising MLM stacks employing various binary layer materials and capping layer(s) including single and binary capping layers for utilization in plasma generated EUV light source chambers, particularly where the plasma source material is reactive with one or more pf the MLM materials, such as a lithium plasma source material.

DETAILED DESCRIPTION OF PREFERRED EMBODIMENTS

Figure 1:
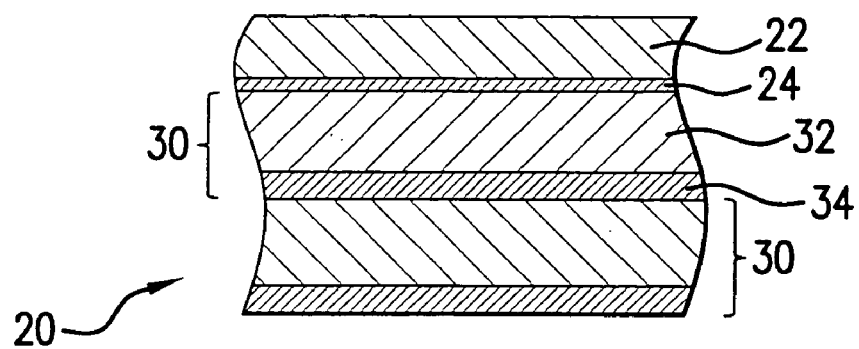
FIG. 1 shows schematically and not to scale a multilayer mirror (MLM")

Turning now to FIG. 1 there is shown schematically and not to scale a prior art MLM 20 structure and composition including a ruthenium capping layer 22 and an underlying intermediate layer 24, which may be, e.g., a source material diffusion barrier layer 24, which may be selected for its resistance to diffusion of a selected material, or its compounds, e.g., the source material for the EUV plasma, e.g., lithium. The MLM 20 may comprise be made up of a plurality of binary layers 30 made up of an absorber layer, e.g., a molybdenum layer 32 and a spacer layer 34 e.g., of silicon.

Source material diffusion through the diffusion barrier layer 24 and into the binary layer(s) 30 and the formation between the layers 32 and 33 of a source material silicide, e.g., lithium silicide, which can cause, e.g., a roughness of the Mo and/or Si at the Mo/Si interface. This can detract from the binary layers 30 thermal stability at elevated temperatures, and also impact the reflectivity of the individual binary layers 30 and the MLM as a whole.

Figure 2:
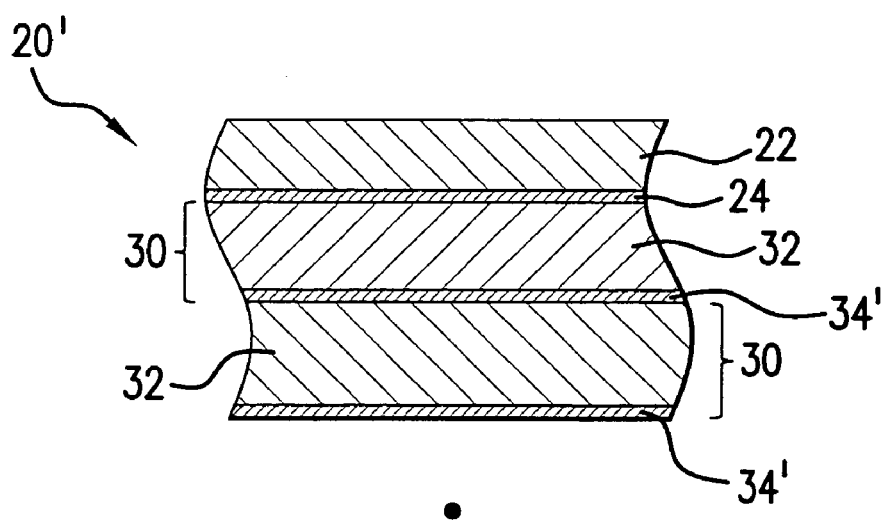
FIG. 2 shows schematically and not to scale an MLM structure and composition according to an aspect of an embodiment of the present invention improving upon, e.g., the MLM of FIG. 1.

FIG. 2 shows schematically and not to scale a MLM 20' like that of FIG. 1 with the spacer layer 34, e.g., of silicon replaced with a spacer layer 34', which may comprise a layer of spacer material, e.g., silicon, doped with a material that will react with lithium, e.g., an n-type dopant, e.g., phosphorous. This silcide layer 34' which can then serve to block the diffusion of the reactive source material, e.g., lithium through the doped silicon layer 34' resulting in the prevention of the formation of, e.g., a silicide layer at the interface between the Mo and Si and therefore, being much less destructive of the effectiveness of the respective binary layer 30 and the MLM 20' as a whole.

By applying the effectiveness of a doped layer 34' blocking or at least significantly reducing the diffusion of the reactive source material, e.g., lithium through the silicon layers 34' in the multilayer mirrors 20', the lithium will not penetrate so deeply into the n-doped Si layer 34', or form a silicide at the Si/Mo boundary.

The Si layers 34' of a multilayer mirror 20' binary layer 30, e.g., for reflecting EUV light at around 13.5 nm EUV, with the introduction of the dopant material, e.g., an n-type dopant reduces the solubility of lithium. This eliminates (or at least strongly reduces) penetration of the silicon layer 34' by diffusion of lithium and prevents or strongly reduces the formation of silicides at the Mo/Si interfaces. Reduction of intermixing and reaction zones at the interface of the materials of the binary layer 30, e.g., the Mo/Si interface can preserve more sharply defined multilayer boundaries that produce higher reflectivities and better thermal stability.

According to aspects of an embodiment of the present invention this can be applied to other well-known types of Mo/Si multilayers and also to the proposed high-temperature stable multilayer mirror candidates (like $MoSi_2/Si$, $Mo_2C/Si$ or Mo/Si multilayers with other interface layers such as thin diffusion/intermixing barrier layers). Here also, if a reactive source material, e.g., lithium gets in contact with the material of, e.g., a spacer layer, e.g., a Si layer, e.g., a silicide formation and intermixing can occur. Again, this can reduce the contrast at the multilayer boundaries and lead to a reduction in the MLM reflectivity and thermal stability. The doping of the spacer layer material, e.g., with an n-type dopant can have the same beneficial effect in these other forms of MLM binary layers in addition to simply Mo/Si Even with the multilayer mirror protective capping layer 22, e.g., of ruthenium capping the underlying binary layers 30 comprising, e.g., a Si spacer layer 34 and a molybdenum absorber layer 32 the reactive source material, e.g., lithium may still penetrate to the underlying silicon layers 34', e.g., through voids and grain boundaries of the capping metal layer 22 and even through underlying absorber layers 32, e.g., molybdenum layer 32. Lithium can then diffuse into the bulk of the Si layers 34'. The diffusion rate of Li into Si depends on the solubility of lithium in Si because the lithium concentration cannot exceed the solubility. The solubility is higher for higher temperatures and for p-type doped Si. Therefore, and in particular for MLMs operated at elevated temperatures, it is of advantage to use n-type doped (e.g., phosphorus-doped) Si, since this decreases the solubility and thus the bulk-diffusion of lithium into the silicon.

The Si spacer layers 34' of the MLM coatings are n-type doped (resistivity ~10–30 $\Omega$cm). This can be done for instance, by using an appropriate n-type doped sputter target, if the coating is produced by a sputtering technique like magnetron sputtering. Even at higher temperatures the lithium diffusion into the Si layer 34' is reduced.

Figure 3:
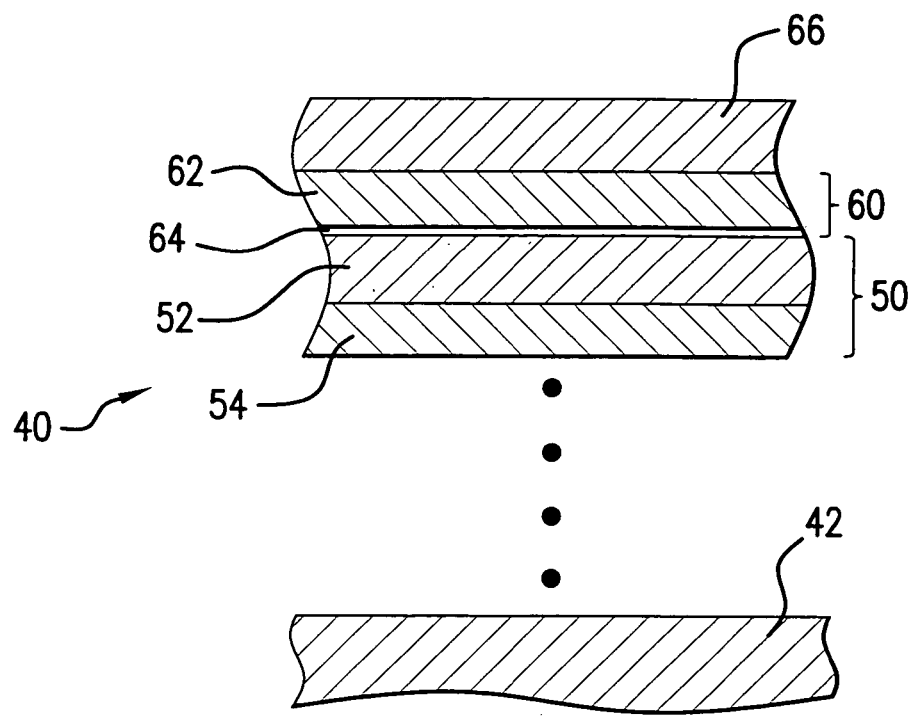
FIG. 3 shows schematically and not to scale a multilayer mirror.

Turning Now to FIG. 3 there is shown schematically and not to scale an MLM 40, which may comprise a plurality of binary layers 50 built onto a suitable substrate 42, which may comprise, e.g., silicon, silicon carbide or molybdenum. The plurality of binary layers 50 may each comprise an absorber layer, 54, made, e.g., of molybdenum and a spacer layer 52 made, e.g., from silicon. The plurality of binary layers 50 may be capped by a binary capping layer 60, made, e.g., from a top capping layer 62 of ruthenium underlain by a source material diffusion barrier layer 64, e.g., made of, e.g., a carbide or a boride or a nitride, or yttrium or zirconium, or compounds or alloys thereof. The binary capping layer 60 may in turn be covered with a coating 66 comprising, e.g., the reactive source material itself, e.g., lithium.

This coating layer 66 of lithium may be the direct result of creating plasma of lithium in close proximity to the collector/director formed using the MLM 40, e.g., with an LPP initiating the plasma by irradiation with a laser beam of a target made of the source material, which may be, e.g., lithium. The collector/director mirror 40 of the EUV light source, e.g., an LPP EUV light source, but also perhaps a DPP EUV light source, will likely be covered by a layer 66 comprising, e.g., several atomic layers of lithium originating from the source. If the lithium coating 66 is only a few nanometers thick, the mirror 40 reflectivity will not be significantly reduced according to applicants' assignee's investigations. Ending the coating with a Ru capping layer 60 that is, e.g., resistant to attack by a reactive source material, e.g., lithium and also, e.g., to oxidation, e.g., ruthenium may be a solution to corrosion and/or oxidation.

Figure 4:
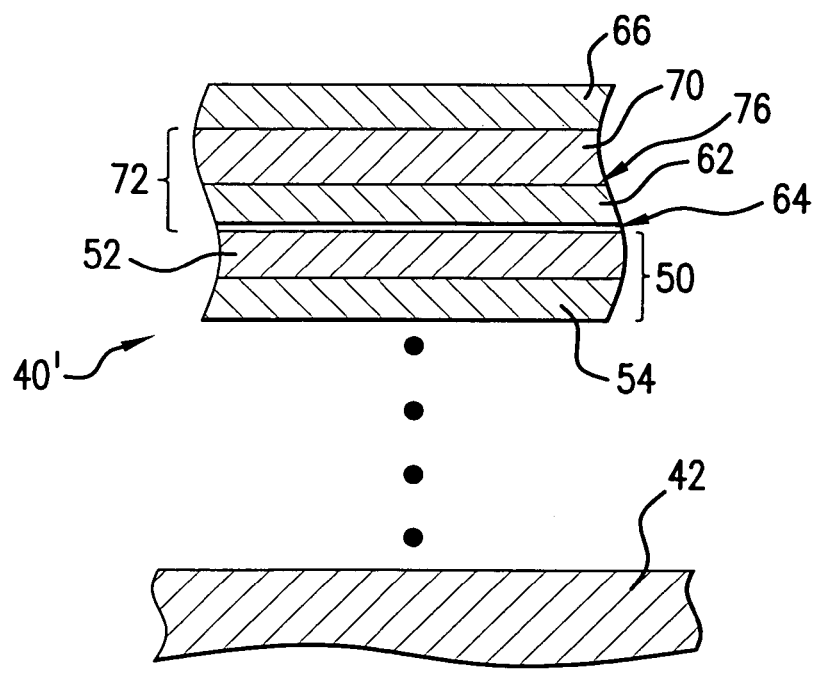
FIG. 4 shows schematically and not to scale an MLM structure and composition according to aspects of an embodiment of the present invention improving upon, e.g., the MLM of FIG. 3.

However, as shown in FIG. 4, applicants propose to place a relatively transparent spacer layer 70 on top of the capping oxidation and corrosion resistant layer, e.g., a Ru capping layer 60, which can conserve the bilayer spacing of the multilayer mirror 40' and, therefore lead to a smaller reduction of the peak reflectivity. Such a layer 70, which may be comprised of, e.g., a compound of the material, the diffusion of which is to be blocked, also needs to be resistant to lithium exposure. The placement of the relatively transparent spacer layer 70, as discussed in more detail below, on the Ru layer 62 can form a binary capping layer 72 that acts much like the underlying binary MLM stack binary layers 50 in contributing to the reflectivity of the MLM 40'.

A collector/director mirror may be formed of a high-temperature, e.g., around 250° C. to 500° C.-stable multilayer stack, which can include binary layers of Mo and/or its compounds and Si and/or its compounds, e.g., $MoSi_2/Si$ or $Mo_2C/Si$, and also including, e.g., Mo/X/Si/X, where X represents a compound thin film that can be used as interdiffusion barrier layer. All these possible stacks however, can contain an element that is reactive with a reactive source material, e.g., lithium, e.g., Si or silicon-compound layers that are prone to attack by and chemical reaction with, e.g., lithium. The Mo and/or Mo compound layers may not completely inhibit diffusion of lithium to the underlying layers. A ruthenium capping layer, preferentially deposited on top of a very thin diffusion barrier consisting of, e.g., borides or carbides or nitrides, like C, $B_4C$, BN, SiC, $ZrB_2$, $NbB_2$, ZrN, NbN, $Si_3N_4$, etc., can serve to protect the layers below from lithium attack. Even if the MLM collector/director mirror is heated, in an effort to evaporate deposited debris comprising the reactive source layer, e.g., lithium, several atomic layers of lithium deposition can build up on its surface due to the exposure of lithium flux from the DPP/LPP source. The layer thickness of a monolayer (a single atomic layer) of lithium can be, e.g., about 0.3 nm. A few monolayers of lithium will not absorb much 13.5 nm EUV light, e.g., the single-pass transmission of a 20 nm thick of lithium is around 80%. Nevertheless, the lithium layers will reduce the reflectivity of the coating. This is in part because the lithium absorber layer is deposited in the "wrong place" on the multilayer stack. In addition, the Ru layer may have voids through which the lithium may reach the underlying Si layer(s) where it will induce chemical reactions leading to a degradation of the reflection properties of the multilayer stack.

As shown in FIG. 4 the multilayer mirror 40' having a plurality of binary layers 50 optimized for around 13.5 nm and for high-temperature stability must be protected against diffusion, reaction and corrosion, e.g., by a reactive source material, e.g., lithium This can be done by means of, e.g., at least one protective capping layer 60 made of Ru as shown in FIG. 3. Multilayer mirrors, e.g., MLM 4' optimized for ~13.5 nm typically require silicon spacer layers 52. If the mirror 40' is exposed to a reactive source material, e.g., lithium, however, the silicon layer(s) 52 needs to be protected from attack by lithium. This can be achieved by a ruthenium capping layer 60, which may be separated from the last Si layer 52 by a thin diffusion barrier layer 64, since the Ru in capping layer 62 is not attacked by lithium. Furthermore, lithium will not diffuse into the Ru layer and/or through the barrier layer 64 to the underlying binary MLM layers 50. However, the Ru capping layer 62 can only be a few nanometers thick in order not to significantly reduce the reflectivity of the MLM 40. A very thin diffusion barrier layer 64 consisting of, e.g., borides or carbides, e.g., less than 1 nm thick, can aid in providing a well-defined layer boundary between the Si and the Ru capping layer.

In order not to significantly decrease the over-all reflectivity of the MLM 40, however, a further improvement may be obtained as shown with respect to the improved MLM 40' shown in FIG. 4, if the protective capping layer 62 is itself a binary layer 72, as shown in FIG. 4. Such a structure according to aspects of an embodiment of the present invention can act like the binary absorber/spacer layers 50 of a MLM 40'. This capping binary layer 72 can consist of an absorber layer 62, e.g., comprised of the Ru capping layer 62, shown in FIG. 3, and an appropriate spacer layer 70, which may comprise compound of a reactive source, e.g., a lithium niobate ($LiNbO_3$) layer 70.

The selected binary capping binary layer 72 spacer layer 70 can be chosen to have a fairly high transparency to the selected EUV wavelength, e.g., 13.5, to act as a capping binary layer 72 spacer layer 70 and also to block diffusion of reactive source material, e.g., lithium through the capping binary layer 72 spacer layer 70 and into the underlying layer 62 and further into the underlying binary layers 50 containing material with which the reactive source material, e.g., lithium is desired to be prevented from reacting, e.g., silicon. The compound of the reactive source material, e.g., lithium niobate, can also serve to allow for some additional built up of source material, whether reactive with the underlying layers or not. The buildup of source material, whether reactive of not, e.g., lithium, but also possibly tin, iridium or xenon, on top of the $LiNbO_3$ layer 70, will occur at the correct position for interference within the capping binary layer 72 absorber layer 70, e.g., comprising lithium. The overall reflectivity of the MLM 40' will not be significantly affected. That is to say, the spacer layer 70 formed on the absorber Ru layer, forming a binary capping layer 72 functions similarly to the underlying binary layers 50 for purposes of reflectivity, because is comprises a relatively transparent (to the desired EUV wavelength) compound of the plasma source material, whether reactive or not, and can accommodate the additional deposition of further source material, e.g., comprising several atomic monolayers of source material (which may also diffuse into the source material compound accommodating even more than several monolayers of deposition, without fundamentally changing the performance of the source material compound (e.g., $LiNbO_3$), but also including other perhaps less reactive source material compounds, e.g., compounds of tin, iridium or xenon). A further advantage of such a layer 74, e.g., comprising a lithium niobate film is that lithium niobate films are stable and not reactive in a lithium environment.

Lithium can diffuse into the $LiNbO_3$ layer 74, but an equilibrium is reached. In other words, the top layer 70 of the capping binary layer 72 is basically just like a Mo/Si multilayer 50, but the capping binary layer 72 is made of Ru and $LiNbO_3$ that have more favorable chemistry and can protect the underlying multilayer mirror binary layers 50, comprised, e.g., of Mo/Si binary layers 50 from attack by lithium. The reflection and transmission properties of the Ru/$LiNbO_3$ capping binary layer 72 at around 13.5 nm are not quite as good as for a Mo/Si bilayer 50, but its resistance to lithium attack more than offsets this drawback. By having in addition a diffusion barrier layer 64 under the capping Ru layer 70, as shown in FIG. 4, the diffusion of the lithium to the underlying silicon layers 52 can be reduced further and the protection from lithium attack can be increased, while at the same time obtaining a better overall reflectivity for the MLM 40' than with just a Ru capping layer 62 as shown in FIG. 3.

According to the above for the improvement of the over-all multilayer stack reflection capabilities, a spacer layer 70 may be placed above the ruthenium layer 62 which can receive the depositing lithium from the exposure of the MLM 40' to lithium, the layers 62, 70 comprising a capping binary layer 72. This spacer layer 70 is selected to be compatible with lithium. Lithium niobate is proposed, due, in part, to a number of useful properties. The selected material, e.g., lithium niobate for use when the source material is lithium, is very stable and not reactive; it can be safely subjected to source material, e.g., lithium exposure/diffusion since it already contains the source material, e.g., lithium; it is one of the few lithium compounds that can be handled without problems in air due to its chemical stability; it has excellent temperature stability, up to at least around 1000° C.; it is mainly an electro-optical material (piezoelectric, ferro-electric, non-linear crystal); flat wafers or curved surfaces can be used as substrates, e.g., for forming the MLM by coating of multiple layers along with the top capping layer 70 of $LiNbO_3$. Thin films of such materials as lithium niobate may be generated, both polycrystalline and amorphous as well as with epitaxial growth using a variety of processes (CVD, laser-deposition, sputtering techniques). Lithium niobate, as other possible materials that may be selected, is also very transparent at the EUV wavelengths of interest, e.g., lithium niobate is almost as transparent as silicon at 13.5 nm. Lithium will diffuse into the $LiNbO_3$, but an equilibrium will be reached. Another very thin (<1 nm) inter-diffusion barrier layer 76 may optionally also be introduced between the layers 62, 70 of the capping binary layer 72 comprising, e.g., the Ru layer 64 and the $LiNbO_3$ layer 70 to reduce lithium diffusion to the underlying silicon layers even further. This barrier layer 76 comprising, e.g., materials noted heein for such layers, can improve the protection from lithium attack. With a layer thickness of the Ru layer 62 of about 2.5 nm and a thickness of the LiNbO₃ layer of about 4.4 nm the "correct" bilayer thickness ratio for 13.5 nm light is obtained. During use of the mirror 40', the lithium built up on its surface will now be in the "right" position, i.e., at the correct spacing from the underlying layer boundaries due to the presence of the spacer layer 70 on an absorber layer 62.

Highly reflective surfaces can be achieved by two general approaches: the most straightforward is the utilization of a material which is inherently reflective in its monolithic form (e.g., aluminum, silver or gold). The second is to construct multiple thin layer stacks of alternating thickness and refractive index. The latter system type is generally referred to as a dielectric mirror; because high reflectance is achieved not through the inherent high reflectivity of the material, but rather an optical interference processes that depends on the thickness and refractive index n of each layer. Precisely constructed thin film stacks can result in >99% reflectance, for visible light, though less for EUV, even when the materials involved are inherently transparent.

Applicants also propose to use a dielectric multilayer mirror with >70% reflectivity at 13.5 nm using, e.g., layers of a silicon compound of alternating density, e.g., alternating layers of SiC each having a different density. SiC can handle high temperatures (2700° C.) and can be doped to improve electrical conductivity or other properties, e.g., diffusion deterrence, if desired. Since SiC/SiC stacks are of the same composition, thermal inter-diffusion of the layers will not be an issue for applications up to, e.g., 700° C. and even above. Since SiC can be made electrically conductive by doping, DC or RF biasing of such a stacked mirror is also possible.

Figure 5:
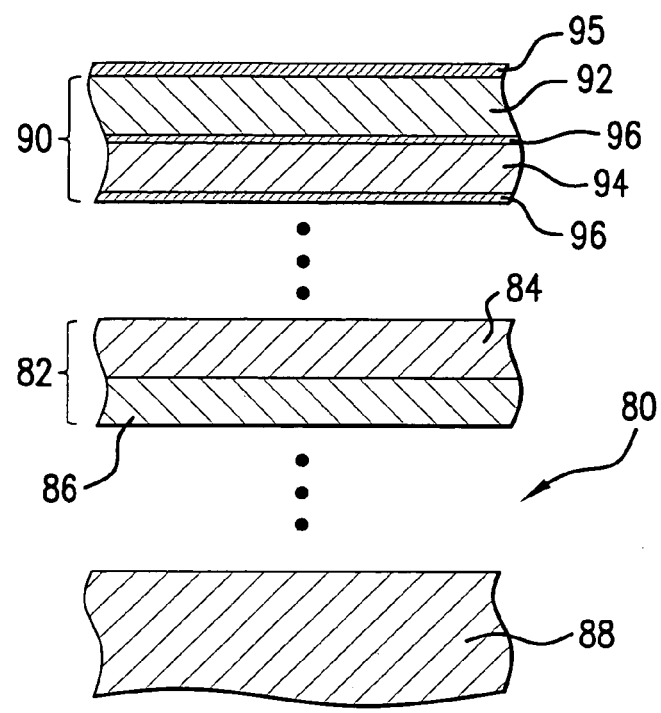
FIG. 5 illustrates schematically and not to scale, aspects of an embodiment of the present invention using coatings compatible with lithium, e.g., yttrium (e.g., in the form of yttrium oxide, $Y_2O_3$) as protective coatings, e.g., for EUV multilayer stack collector/director mirrors.

Turning now to FIG. 5, there is illustrated, schematically and not to scale, according to aspects of an embodiment of the present invention applicants proposal to use coatings compatible with lithium, e.g., yttrium (e.g., in the form of yttrium oxide, Y₂O₃) as protective coatings for EUV multilayer stack collector/director mirrors or other EUV reflective optics. A high-temperature multilayer-mirror 80 based on, e.g., multilayers of binary layers, comprising, e.g., Mo, MoSi₂ and Si layers, as noted above, may not be stable against attack by lithium. Similarly to the above discussed aspects of an embodiment of the present invention, according to another aspect of an embodiment of the present invention, yttrium and molybdenum may be even better suited than the capping binary layer of ruthenium and lithium niobate discussed above.

As noted above, high-temperature multilayer mirrors (MLMs) need a protective layer compatible with lithium in order to prevent reaction with lithium and the protective layer and also because the protective layer has to have good EUV properties. At the same time that such materials have to be fairly transparent to EUV radiation, and the topmost layer(s) should also have a good stability with respect to sputtering by source material, e.g., lithium and lithium ions produced from the laser-plasma source. Yttrium, zirconium, molybdenum and other transition metals have a relatively low sputter yield with respect to lithium and are inert to reaction with lithium. In addition, they are still fairly transparent to 13.5 nm EUV radiation. Either a multilayer like Mo/Y, or with barrier layers like Mo/Z/Y/Z may be used as a protection against a reactive source material, e.g., a lithium-protective layer. Similarly, perhaps just a single layer of such a transition metal, e.g., Y, Zr, Nb, Mo, Ru, Rh or Pd or layer of, e.g., a nitride or carbide of such transition metal, e.g., ZrC, YN, ZrN, BN, Si₃N₄, B₄C or a silicide of such transition metal, e.g., MoSi₂ may be used.

Turning to FIG. 5 there is shown a schematic view of an MLM 80 structure and arrangement, not to scale, according to aspects of an embodiment of the present invention. Yttrium may be used in a binary capping layer 90, e.g., as the top or spacer layer 92 of an MLM 80. The MLM 80 may also comprise a plurality of binary layers 82, comprising, e.g., a absorber layer 84, e.g., made of molybdenum and a spacer layer 86, e.g., made of silicon, all forming a multilayer stack on a substrate 88. The binary capping layer 90, with its yttrium spacer layer 92 and molybdenum absorber layer 94 may serve to combat the adverse impacts of a reactive source material, e.g., lithium being deposited on the MLM 80, which ill effects can be managed similarly to the embodiment discussed above with respect to FIG. 4.

Since the yttrium layer 92 will not react with the lithium and if the surface of this top layer 92 oxidizes to form, e.g., a Y₂O₃ layer 95, the yttrium oxide layer 95 is stable against the lithium being deposited, similarly to the lithium niobate discussed above. Similarly other transition metals such as those noted above, e.g., Zr or Mo and their oxides, e.g., a top layer of ZrO₂ and MoO₃ can both serve to absorb the lithium deposition and the yttrium, zirconium or molybdenum can protect the underlying silicon layers from attack by lithium. If the, e.g., yttrium and molybdenum layers 92, 94 are separated by thin lithium diffusion barrier layer 96, e.g., comprising carbides, nitrides or bromides, the diffusion of lithium can be reduced even further and the layers 92,94 will be even more stable at high temperatures, e.g., 400° C.–500° C.+. Applicants believe, however, that in such an application the Mo and Y do not intermix, even at elevated temperatures and without the need for an intermixing barrier layer 96, but that the lithium diffusion barrier layer 96 may still be useful. This may facilitate use without an intermediate intermixing deterring thin film between the Mo and Y layers in the stack. An Mo/Y bilayer capping layer 90 will have a fairly high reflectivity for 13.5 nm radiation. However, they do not reflect 13.5 nm radiation quite as well as Si-based mirrors. However, applicants propose, as shown in FIG. 5 to coat a Si-based high-temperature multilayer mirror with one or more, e.g., several binary capping layers 90 of Mo and Y as discussed above and shown in FIG. 5 (illustrating as an example a single binary capping layer 90) without large loss of reflectivity. Another possibility is to use a Si-free multilayer based only on, e.g., Mo and Y layers or Mo and Y layers and suitable barrier layers against lithium diffusion like ZrC, YN, ZrN or other nitrides or borides throughout the MLM 80, and utilize, e.g., the Y layer as the top capping layer, and perhaps also a coating 95 of Y₂O₃.

As noted a high-temperature multilayer mirror (e.g., with MoSi₂/Si or Mo/C/Si/C or some other multilayer stack may be coated with a lithium-protective capping binary layer(s) comprising molybdenum, yttrium and perhaps also a thin diffusion barrier layer, which may serve as either an intermixing barrier layer, a lithium diffusion barrier layer or both. Either yttrium or molybdenum may be the topmost layer. The structure of the MLM 80 may comprise one or several periodic Mo—Y binary layers with (or without) thin barrier layers between Mo and Y. A thin yttrium oxide (Y₂O₃) layer (or a Mo-oxide layer) may form automatically after the coating process on topmost layer, e.g., when the mirror is exposed to air. In any event, yttrium, molybdenum and yttrium oxide are resistant to lithium attack. Highly oxygen-free yttrium according to aspects of an embodiment of the present invention may be used for the Y layers and the coating could be done in a coating system with very low base pressure, e.g., around <10⁻⁸ Torr, in order to, e.g., prevent coating with oxide layers during the processing, which may tend to produce higher layer roughness and thus interface roughness. To increase the thermal stability and reduce diffusion of lithium through the Mo/Y capping binary layer(s) there could be thin barrier layer between each Mo and Y layer. The thin barrier layer may increase the contrast between the Mo and Y layers, and also serve as a diffusion barrier for lithium in order to prevent penetration and diffusion of lithium to the lower layers of the multilayer stack. Good candidates for the barrier layers are certain nitrides, carbides or borides (like $Si_3N_4$, BN, ZrN, NbN, C, ZrC, NbC, SiC, $B_4C$, $ZrB_2$, $NbB_2$, YN, $YB_6$). The thin barrier layer on top of the Mo layer can be different from (or the same as) the thin barrier layer on the Y layer. The thickness of such barrier layers can be different (or equal). It could also be that there is only one barrier layer used (instead of one each), e.g., on top of either the Mo or the Y layer, i.e., between binary layers and not between every layer of the MLM stack.

For high reflectivity of the multilayer mirror stack at 13.5 nm, the thickness of the yttrium layers is near 4 nm, the thickness of the Mo layers is near 2.0 nm, the barrier layer thickness may be less than 1 nm, e.g., about 0.5 nm. The thickness of the yttria layer that forms on the top yttrium layer may be less than 2 nm thick if the yttrium layer itself has a very low oxygen content, otherwise the complete yttrium layer may oxidize. The topmost layer can be larger than 4 nm. The topmost layer can be any of a variety of transition metals, e.g., yttrium, zirconium, molybdenum or ruthenium. This may also be formed into and oxide, e.g., in case of yttrium it can be $Y_2O_3$, about 2 nm thick, which develops after first exposure of the MLM to air. When the LPP light source is in operation, the coated mirror may be covered by a very thin (<1 nm) layer of adsorbed lithium.

Yttrium may be used as the so-called spacer (in place of silicon for the normal MLMs) and molybdenum as the "absorber", e.g., in the protective binary capping layer. Other possible spacer layers in place of yttrium could be yttrium-scandium alloys, scandium or calcium or calcium-zirconium, since these and their oxides ($YScO_3$, CaO, $Sc_2O_3$, CaZrO) are resistant to lithium attack and still fairly transparent to 13.5 nm EUV radiation, although not quite as transparent as Y and $Y_2O_3$. Yttrium is one of the most thermodynamically stable substances against reaction by hot lithium, even at 800° C.

Alternatively, rather than coating a silicon-based high-temperature multilayer mirror with Mo/Z/Y/Z, where Z stands for a thin barrier layer, applicants propose according to aspects of an embodiment of the present invention to construct a lithium-compatible high-temperature MLM by just using a Mo/Z/Y/Z multilayer MLM stack, e.g., with yttrium as topmost layer, without using any silicon layers. The barrier layers Z may also be omitted. Applicants believe that in such a construction there will be little intermixing of the layers, even at elevated temperatures, thus possibly eliminating at least one need for thin intermediate layers, i.e., deterrence of such intermixing leading to thermal instability. The single-pass EUV transmission at 13.5 nm through a 1 nm thick layer is 99.83% for Si, 99.0% for $SiO_2$, i.e., for silicon-based materials, and 99.79% for Y, 98.97% for $Y_2O_3$, 99.57% for $YB_6$, i.e., for yttrium-based materials.

According to aspects of an embodiment of the present invention, applicants propose that high-temperature multilayer mirrors and lithium-protective coatings be applied during the production process to substrates at elevated substrate temperatures. This can serve to enhance the mobility of the atoms adsorbed during deposition and thus lead to lower layer roughness. Higher mobility on the surface produces more smooth coatings and interfaces. Since the high-temperature coatings last at higher temperatures, e.g., in the range of 400° C. to 600° C. they may also be produced at these temperatures.

During the multilayer production (coating) process the substrate may be kept at elevated temperatures, e.g., somewhere in the range of about 300° C. to 500° C. The atom mobility during the deposition process is thereby enhanced. In addition to leading to a smoothening of the interfaces and a reduction in layer roughness, this will also produce slightly more dense layers which is also beneficial. Applicants propose keeping the substrate at higher temperatures during the layer deposition process rather than using a later annealing at elevated temperatures after deposition at room temperature.

As an example a high-temperature multilayer mirror consisting of alternating $MoSi_2$ and Si layers, which show stable reflectivity at 13.5 nm at up to 600° C., produced in the manner just described. Other types of high-temperature stable MLM coatings may also be produced in this way. For some MLMs, however, e.g., a normal Mo/Si multilayer mirror, which is not stable at such elevated temperatures, e.g., without intermediate layers, e.g., intermixing deterrence layers, deposition at these high temperatures does not help, but can lead to severe degradation of the multilayer structure (e.g., by intermixing) during the production process.

According to aspects of an embodiment of the present invention applicants propose to use $MoSi_2$/Si multilayer coatings, since these multilayers have good thermal stability, at least in part because $MoSi_2$ and Si are in phase equilibrium and thus form stable interfaces at the boundary between the two materials without intermixing. Other absorber/spacer multilayers which are also materials possessing the other qualities of MLM multilayers for EUV applications, as noted above, and are also materials that are in phase equilibrium may also be used. The Mo content in the $MoSi_2$ may have to be increased to elevate the reflectivity. Other materials may include, e.g., $Mo_5Si_3$ which is in phase equilibrium with $MoSi_2$ used "inside of" the $MoSi_2$ layer, i.e., a $MoSi_2$/$Mo_5Si_3$/$MoSi_2$/Si as the multilayer structure absorber layer. For this system, all interface interfaces are made between layers that are in phase equilibrium, the Mo content is increased and the reflectivity is therefore higher. According to aspects of an embodiment of the present invention, $Mo_5Si_3$ is used as the main absorber in a multilayer structure where Si is the spacer. $Mo_5Si_3$ gives higher reflectivity than $MoSi_2$ in a multilayer stack together with Si spacers. The layer structure is: Si—$MoSi_2$—$Mo_5Si_3$—$MoSi_2$—Si—$MoSi_2$—$Mo_5Si_3$—$MoSi_2$ and so on. This forms a binary (absorber/spacer) layer with an extra-absorber, e.g., $Mo_5Si_3$, which may not be compatible at the interface with the Si spacer layer, e.g., by being in phase equilibrium with the Si, sandwiched between the lesser absorber, but Si layer interface compatible $MoSi_2$ "normal" absorber layer, i.e., "inside" the normal $MoSi_2$ layer, thereby providing that only intermixing and diffusion compatible layers, e.g., layers in phase equilibrium are next to each other, while providing better reflectivity at the desired wavelengths. Thereby substantially preventing intermixing due to diffusion between layers at elevated temperatures results in the multilayer coating being more stable to temperatures up to about 700° C., for high-temperature application of multilayer mirrors in that part of the EUV wavelength range where normally Mo/Si mirror coatings are used. For application with a reactive source material, e.g., a lithium DPP or LPP source, a Li-compatible capping layer(s) different from $SiO_2$ may be required as discussed above.

Normal Mo/Si multilayer mirrors degrade at temperatures above 100–200° C. due to interdiffusion/intermixing and are thus high temperature unstable without intermixing barrier layers that can reduce reflectivity. $MoSi_2$/Si coatings are stable at high temperatures but due to its optical properties the $MoSi_2$ layer does not provide enough contrast and the peak reflectivity is not so high. Use of $Mo_5Si_3$ increases this contrast in the multilayer stack since (compared to $MoSi_2$) its optical properties are more similar to Mo. The theoretical reflectivity of $Mo_5Si_3$/Si multilayers can exceed R=70% at 13.5 nm (e.g., for N=80 layers). Thin layers of $MoSi_2$ between the main $Mo_5Si_3$ and Si layers do not reduce this number by much.

Figure 6:
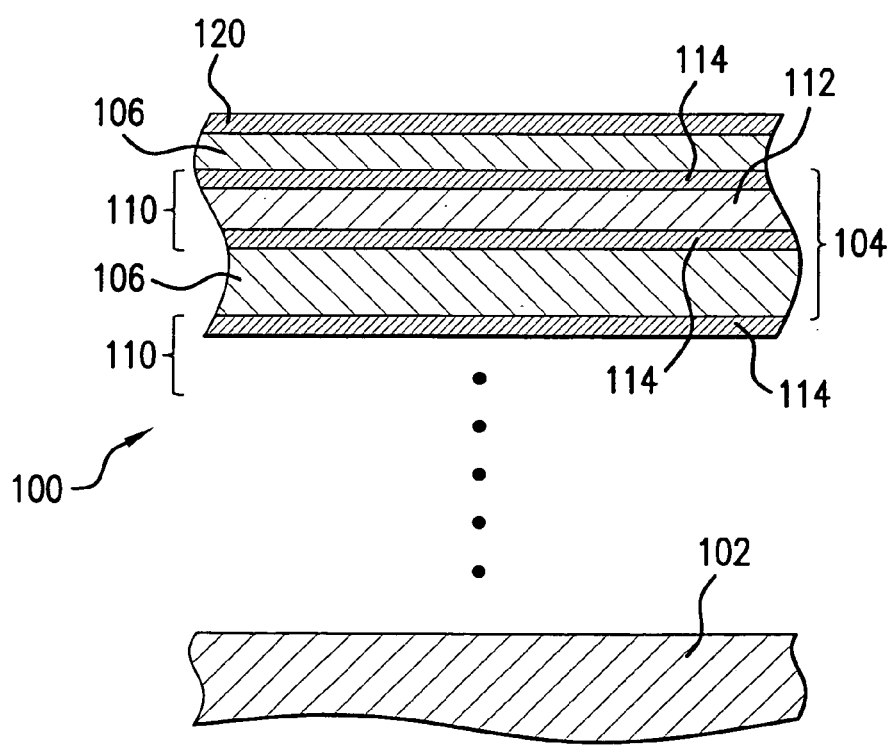
FIG. 6 illustrates schematically and not to scale an MLM structure and composition according to aspects of an embodiment of the present invention.

According to aspects of an embodiment of the present invention, as shown in FIG. 6 an MLM 100 may be formed on a substrate 102 by the substrate 102 being coated by N successive binary layers 104 comprised of Si—$MoSi_2$—$Mo_5Si_3$—$MoSi_2$ where Si layer 106 is the relatively transparent (at around 13.5 nm) spacer layer and the sandwich layer 110 comprising, e.g., a $Mo_5Si_3$ layer 112 between two layers 114 which are both adjacent Si layer 106 interface compatible and adjacent $Mo_5Si_3$ layer 112 interface compatible, e.g., made of $MoSi_2$, with the layer number N somewhere in the range of, e.g., 40–120. Similar to the usual Mo/Si multilayer the topmost layer is silicon may form a thin e.g., about 2 nm thick $SiO_2$ capping layer 120 at the top after exposure to air. However, other capping layers as discussed herein, e.g., yttrium, molybdenum, ruthenium, rhodium or palladium and compounds and combinations thereof could also be considered to form, e.g. single capping layers or binary capping layers as discussed herein.

The individual layer thickness of the MLM 100 may be to be optimized for the respective wavelength of use. For optimization at 13.5 nm the thickness of the total Si—$MoSi_2$—$Mo_5Si_3$—$MoSi_2$ binary layer 104 may be, e.g., around 6.9 nm. The Si layer 106 thickness may be, e.g., about 4 nm. The thickness of the $MoSi_2$ sandwiching layers 114 may be, e.g., about 1 nm or less, typically, e.g., about 0.5 nm or even less. The thickness of the $Mo_5Si_3$ sandwiched layer may be, e.g., about 2 nm in order to give the right total thickness and absorber to spacer ratio for the selected wavelength, e.g., about 6.9 nm total thickness and about 0.4 nm absorber thickness providing an absorber to spacer thickness ratio for 13.5 nm. The thickness of the capping layer 120 should be around ca. 3–4 nm or more, if higher protection is required.

According to aspects of an embodiment of the present invention, if Si or Y is the capping layer, it is best deposited on top of the $MoSi_2$—$Mo_5Si_3$layer-$MoSi_2$ absorber sandwich layer 104, since Si and Y are highly transparent at around 13.5 nm and serve as spacers in the multilayer stack. If, on the other hand, Mo, Ru, Rh or Pd is used as the capping layer, it is best deposited on top of the Si layer 106, since they serve as absorber layers.

Figure 7:
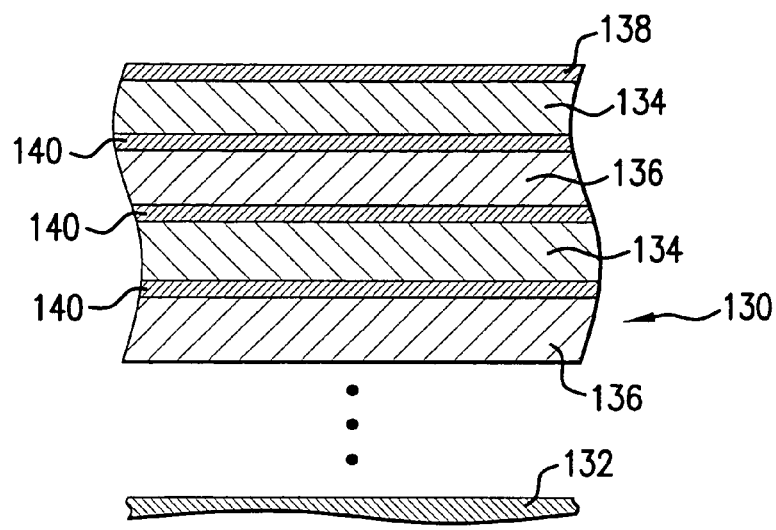
FIGS. 7, 8 and 9 illustrate schematically and not to scale an MLM structure and composition according to aspects of an embodiment of the present invention.
Figure 8:
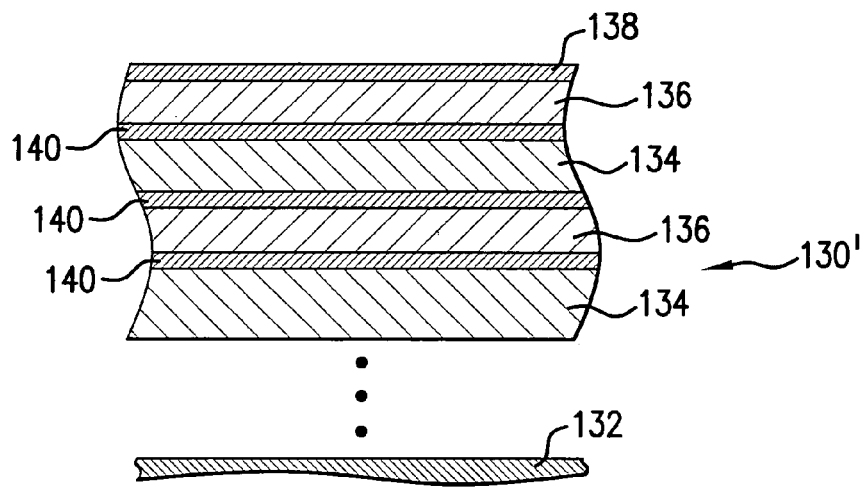
Figure 9:
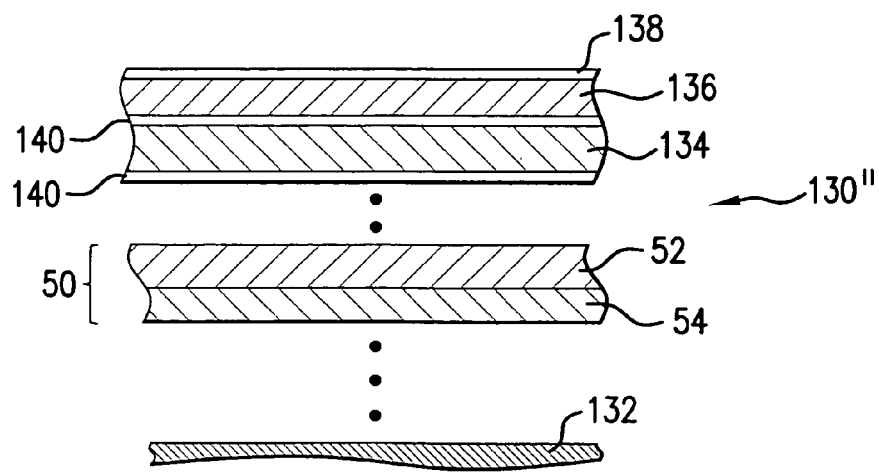

According to aspects of an embodiment of the present invention, applicants propose to take advantage of the fact that MoRu alloy forms an amorphous layer rather than a polycrystalline layer. Amorphous layers can act much better as a diffusion blocker, e.g., deterring lithium diffusion, than polycrystalline layers, since the lithium can penetrate along grain boundaries in polycrystalline layers. A multilayer system 130, 130' and 130" for high reflection of 13.5 nm EUV radiation which blocks lithium diffusion, as shown in FIGS. 7, 8 and 9, can be stable against reaction with lithium and also stable at high temperatures. It can be a high-temperature multilayer coating on its own as shown in FIG. 7 or it can be a protective multilayer coating on top of (capping) such a multilayer coating as shown in FIG. 8 or on top (capping) a more reflective high-temperature multilayer coating that uses silicon and/or silicon compounds as shown, e.g., in FIG. 9.

Certain elements, e.g., yttrium and zirconium are compatible with lithium (do not react with lithium) and are also highly transparent to 13.5 nm radiation. An alloy of them can be used in the "spacer" layer 134 of the multilayer stack. A Y—Zr alloy forming the layer 134 is used as the "spacer" layer. Certain elements, e.g., molybdenum and ruthenium also do also not react readily and directly with lithium. An alloy of them can be used as "absorber" layer 136 materials in the multilayer stack 130, 130' and 130" shown in FIGS. 7–9. A Mo—Ru alloy can also is used as the "absorber" layer 136. However, oxides of the transition metals like Y, Zr, Mo, Ru-oxides are susceptible to lithium intercalation, i.e., the lithium can penetrate native oxide layers, e.g., that form on top of the multilayer stack 130, 130', 130" after its exposure to air. Therefore according to aspects of an embodiment of the present invention, an additional diffusion barrier capping layer(s) 138 may be applied. ZrN and YN are good candidates material for this capping barrier layer(s) 138. Since some lithium intercalation may still happen at the topmost capping barrier layer 138, according to aspects of an embodiment of the present invention applicants propose to use similar barrier intermediate layers 140 between the absorber layers 136 and spacer layers 134, in order to stop the diffusion of lithium into the lower layers 134, 136. Mo—Ru alloys will form an amorphous layer, which can also block lithium diffusion better than a polycrystalline Mo layer. The amorphous nature of the layer also reduces the roughness substantially. Some oxidized alloys of zirconium with yttrium are known as "yttria-stabilized zirconia" ("YSZ") may be used as high-temperature barrier coatings, either as a capping layer 138 or intermediate layer 140 or both. They do not undergo any phase transitions at temperatures below about 500° C. They also form epitaxial layers on top of other thin films, which will, therefore, seal better against lithium diffusion. The layer roughness is also reduced. YSZ layers also have smaller grain sizes than pure Zr or $ZrO_2$. The resultant reduced roughness of both absorber and spacer layers leads to higher EUV reflectivity.

A multilayer coating 130, 130' and 130", e.g., as shown in FIGS. 7–9 may be applied with, e.g., a Mo—Ru alloy absorber layer 136 which may comprise, e.g., about 40% Mo and 60% Ru. The composition is then approximately $Mo_4Ru_6$. Mo—Ru used as the absorber layer 136 may be, e.g., about 2–3 nm thick. The Y—Zr alloy may be used as the spacer layer 134 at about 4–4.5 nm thick. For YSZ, the composition is typically 20% or less yttrium and 80% or more Zr. But since yttrium is more transparent than Zr at 13.5 nm it may be preferred to have a higher relative yttrium content than 20% and a lower zirconium content than 80% in the alloy as may be utilized to achieve the maximum reflectivity. The Y—Zr alloy layer is expected to have lower grain size and interface roughness compared to a pure yttrium layer. ZrN is one embodiment of a very thin intermediate barrier layer 140 at about 0.5 nm thick, applied between the Y—Zr and Mo—Ru layers in order to block intermixing and diffusion. Other buffer layer materials can be nitrides like YN, BN, $Si_3N_4$ or carbides like ZrC, $B_4C$, NbC or $Mo_2C$, or carbon or borides like $ZrB_2$, $YB_6$, $MoB_2$, $NbB_2$ or boron.

The optimal total bilayer spacing (Y—Zr layer and Mo—Ru layer plus buffer layers) is about 7.2 nm for high normal-incidence reflectivity at 13.5 nm. The multilayer coating of alternating layers of Mo—Ru and Y—Zr, either separated by buffer layers or not, may be applied on top of the collector mirror substrate 132 as a high-temperature capping coating that is stable under lithium exposure. Or it may be applied on top of a silicon-based binary layer high-temperature multilayer coating, as discussed above, as shown in FIG. 9 as a protective coating for lithium exposure.

The topmost layer can be the Y—Zr alloy as shown in FIG. 7. It will form a native oxidized yttria-zirconia layer 138 upon exposure to air due to oxidation. The capping barrier layer 138 may also be formed of the same ZrN as used in the intermediate barrier layers 140, e.g., on top of a Y—Zr alloy layer as shown in FIG. 7 or on top of a Mo—Ru alloy layer 136, e.g., in order to prevent oxidation as shown in FIG. 8.

The capping or intermediate barrier layers may also comprise two thin layers, like ZrN at about 0.3 nm thick and Y at about 0.3 nm thick. Or the intermediate barrier layers 140 can just be made from Zr and only the topmost capping barrier layer 138 made from ZrN or YN.

The peak reflectivity for a multilayer mirror using a binary layer, with intermediate barrier layers, of Mo—Ru/ZrN/Y—Zr/ZrN at 13.5 nm can be on the order of R=50%, depending on the layer alloy composition. It may be higher for Y—Zr layers with high yttrium content and for Mo—Ru layers with high molybdenum content.

Figure 10:
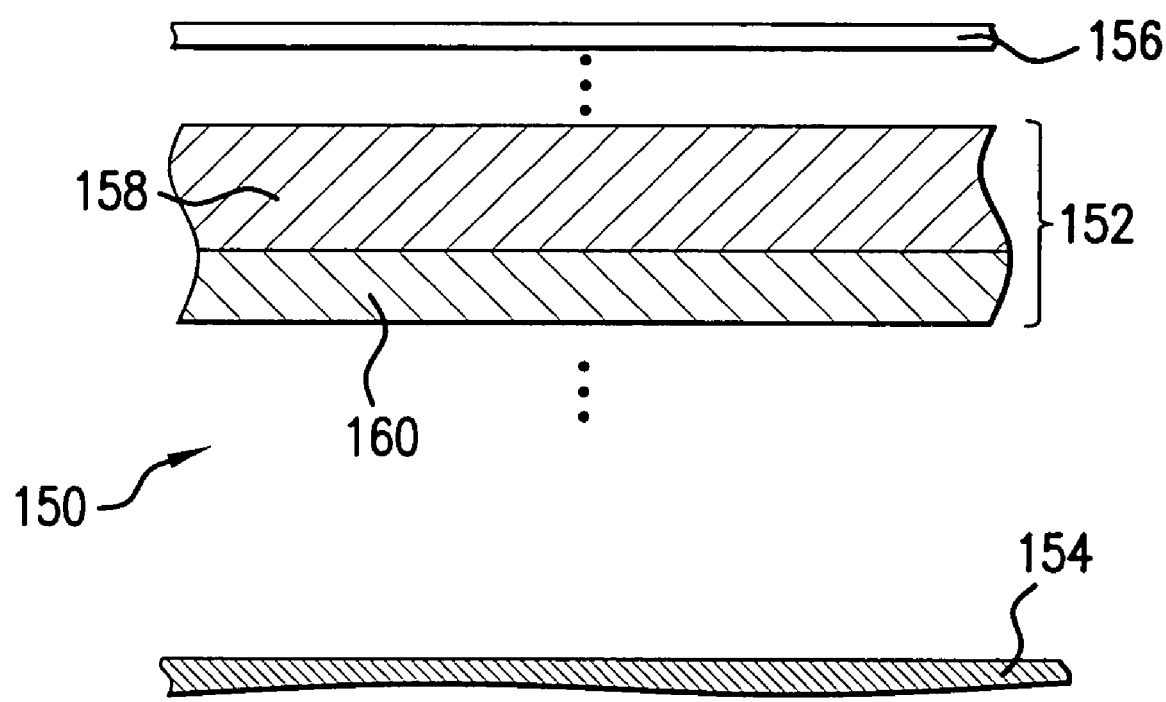
FIG. 10 illustrate schematically and not to scale an MLM structure and composition according to aspects of an embodiment of the present invention.

According to an aspect of an embodiment of the present invention, applicants propose the use of a $MgF_2$ capping layer as a lithium diffusion barrier or an etchant resistant barrier, e.g., resistant to a halogen etchant provided to remove source material from the outer layer of the collector/director or other EUV optic, e.g., Br, i.e., as a barrier to the bromine etching the MLM layers under $MgF_2$ capping layer. The mirror structure of the MLM 150 as shown in FIG. 10 may be, e.g., a plurality of binary layers 152 on a substrate 154 covered with a capping layer 156 of, e.g., a 10 nm layer of $MgF_2$ deposited on top of, e.g., a plurality of standard MoSi2/Si binary layers 152. The $MgF_2$ capping layer may provide a better capping layer than provided in a Ru capped MLM, e.g., on top of MoSi2/Si binary layers 152, comprising $MoSi_2$ absorber layer 158 and Si spacer layer 160 as is known in the prior art, but which do not provide the same level of protection against lithium diffusion, and in addition may not be as temperature stable and also do not resist bromine etching.

Figure 11:
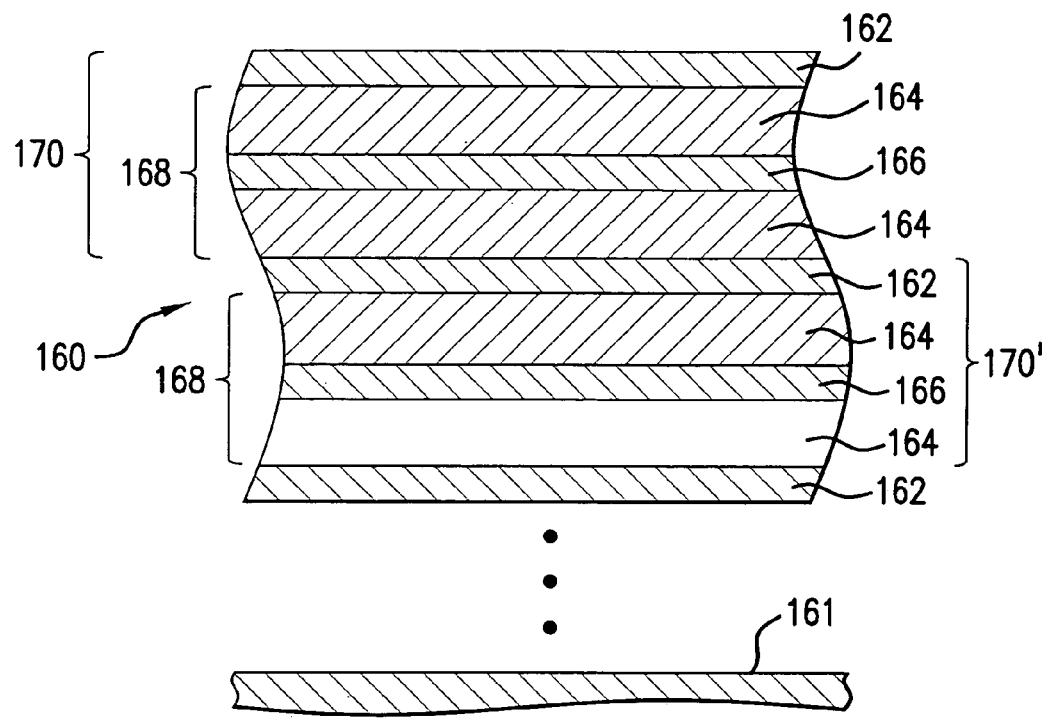
FIG. 11 illustrate schematically and not to scale an MLM structure and composition according to aspects of an embodiment of the present invention.

Turning now to FIG. 11 there is illustrated an MLM 160 structure and composition according aspects of an embodiment of the present invention that utilizes, e.g., a dual-binary MLM stack or otherwise considered a binary layer including a sandwiched absorber layer, comprising, e.g., a yittium spacer layer 162 and a MO absorber layer 164, and a further underlying silicon spacer layer 166 and a further underlying Mo absorber layer 164. This series of dual binary layers 170 can be repeated throughout the MLM 160 stack to the substrate 161, with the topmost Y layer 162 as a capping layer or with other single or binary capping layers as discussed herein. The structure may also be considered as a binary MLM stack layer with a sandwiched Mo/Si/Mo absorber layer 168 as part of the binary layer also comprising the Y layer 162. The dual binary capping layer 170, as shown in FIG. 11 may also form underlying repetitive dual-binary stack layers 170', e.g., to form the entire stack or substantially the entire stack with an advantage that as the dual-binary capping layer 170 becomes degraded in performance, e.g., due to diffusion or boundary intermediate layer/region instability, intermixing or the like the next underlying dual-binary capping layer of the same construction as the original forms the next dual-binary capping layer, and so forth down the stack toward the substrate 161. The thicknesses for the exemplary dual-binary layer shown in FIG. 11 may be, e.g., 4.19 nm Y, 2.75 nm Mo, 4.16 nm Si and 2.84 nm Mo, from top to bottom in the $(Y/Mo/Si/Mo)^N$ MLM 160 as shown in FIG. 11.

Figure 13:
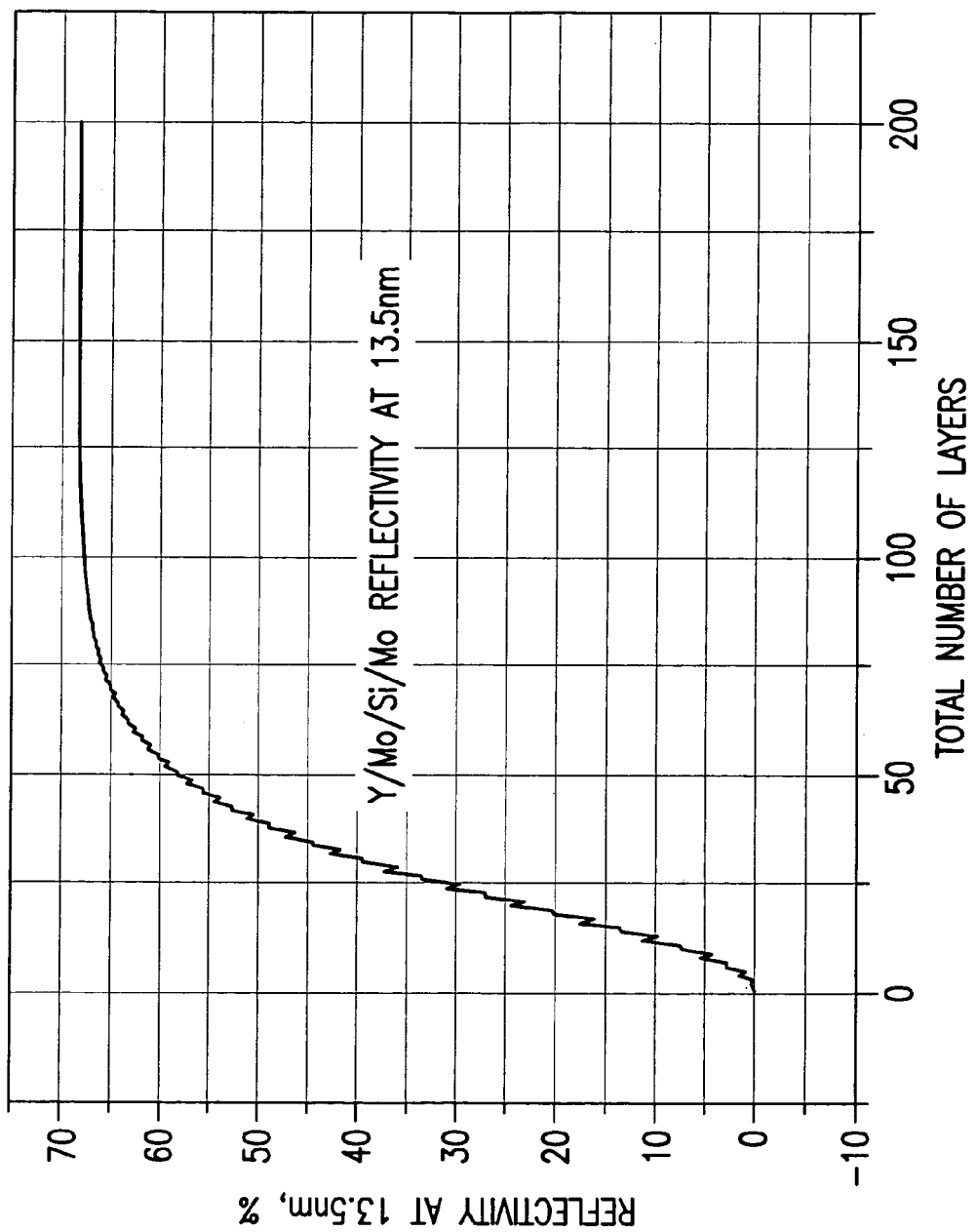
FIG. 13 illustrates the reflectivity of a Y/Mo/Si/Mo MLM for the number of layers.

FIG. 13 shows a graph of the reflectivity at 13.5 nm of such a system for the total number of layers, i.e., for about 100 layers, the repetitions of the four layer stack 168 would be 25. FIG. 13 also shows that this type of four layer stack remains highly reflective with the addition of further layers from, e.g., 100 to 200 and above and further does not decrease much if the stack were to be originally 200 or so layers and be reduced over the life of the mirror to 100 or so.

Figure 12:
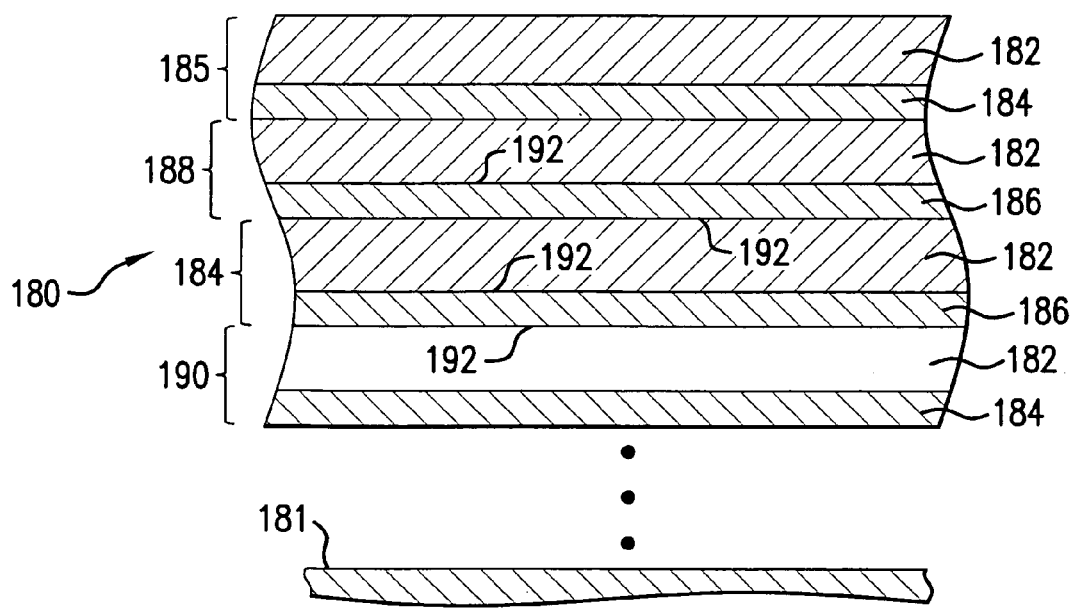
FIG. 12 illustrate schematically and not to scale an MLM structure and composition according to aspects of an embodiment of the present invention.

Turning now to FIG. 12 there is shown schematically and not to scale an MLM 180, on a substrate 181, according to aspects of an embodiment of the present invention. The MLM 180 may comprise a capping absorber layer 182, which may comprise, e.g., Mo and may overlay a spacer layer, e.g., comprising a Y capping spacer layer 184, together forming a binary capping layer 185. The bulk of the MLM 180 may then comprise a plurality of absorber layers 182, which may comprise, e.g., Mo, and may each overlay a spacer layer, e.g., a SiC spacer layer, e.g., with an intermixing boundary intermediate layer 192 of, e.g., a boride or nitride or the like as mentioned herein, e.g., SiB, together forming binary MLM stack layer 188. Also according to aspects of an embodiment of the present invention, a diffusion boundary binary stacking layer 190, e.g., comprised of the same materials as the binary capping and diffusion barrier layer 185, i.e., by way of example the binary capping layer 185 of an Mo absorber layer 182 and a Y spacer layer 184.

Those skilled in the art will understand from the above that a goal is to prevent a reactive source metal, e.g., lithium being deposited on the optical element in the EUV light source generation chamber, from the formation of a plasma from a plasma source material that produces light at the desired wavelength in the EUV range, e.g., at around 13.5 nm, from penetrating deep into the multilayer mirror stack and, e.g., reacting there, e.g., with the silicon in a layer(s) of the MLM stack, which would eventually destroy the multilayer mirror reflectivity and significantly detract from the desirable lifetime of the MLM in the operating environment. One problem is that lithium will easily diffuse through many materials, either directly through the bulk or through grain boundaries or along defects of the coating. Even though it may not react with the material of a capping layer, it could still penetrate and then react with layers below the capping layer. This can relatively rapidly destroy the multilayer structure or at least reduce the reflectance to an unacceptably small value. The fact that the mirror is heated potentially facilitates reactions further since it provides additional energy to stimulate the respective chemical reaction(s). Therefore according to aspects of an embodiment of the present invention applicants propose to use thin coatings that will not substantially react with lithium and/or that will prevent diffusion of lithium to lower layers, even at elevated temperatures of 400° C.–500° C.+. Applying principals learned from the fusion community with barrier coatings to protect the first wall, usually a vanadium alloy from the hot liquid lithium of the divertor system wherein the requirements are somewhat similar to the requirement for a lithium compatible high-temperature multilayer coating, applicants propose improvements to EUV collector/director reflective elements to better suit them for operation in the environment where a reactive source metal is used to generate the DPP or LPP plasma, and the requirements of that environment wherein EUV light is being generated and must be collected and directed to a focus, i.e., considerations such as the requirements for the effective operation of the materials selected in multilayer mirror stacks and at the desired wavelengths. The requirement of high EUV transmission and good thin film properties, low intermixing, low roughness, good layer growth, etc., all have been taken into account by applicants.

Another source of information is research work from the surface science community. They have studied the adsorption, reaction, diffusion and desorption of lithium layers from, generally speaking, single-crystal surfaces, e.g., for applications in semiconductor integrated circuit wafer processing materials sciences. According to aspects of an embodiment of the present invention applicants have considered aspects of, e.g., oxidation of the multilayer coatings when they are exposed to ambient air. Generally, there are two possibilities. A thin oxide layer develops which provides an effective barrier for further oxidation and the coating is approximately "sealed" by a usually thin oxide layer, e.g., in the case of silicon-layer terminated multilayer coatings, which can typically exhibit a 2 nm thick stable $SiO_2$ layer on top and no further oxidation. The second possibility is that the oxide layer thickness keeps growing, e.g., for the case of Mo/Si multilayers, when the molybdenum is the top layer, such that due to exposure to air, the oxygen will keep penetrating a Mo layer until it is fully oxidized. The reflectivity then decreases, since $MoO_3$ oxide absorbs the 13.5 nm EUV radiation considerably more strongly than Mo. According to aspects of embodiments of the present invention applicants have considered the ramifications of these principles to MLM's for EUV collector/director mirror and other reflector elements.

Lithium is less reactive with $SiO_2$ than with bulk Si., however, at least for single-crystal surfaces the adsorption/reaction and diffusion of Li is much less strong for n-type doped Si. At elevated temperatures (e.g., greater than around 250° C., the $SiO_2$ top layer may to react with lithium more easily. Si and Li react to form LiSi (silicide) compounds with various stochiometric mixtures. Bulk silicon has limited reactivity towards Li, but electrochemical reaction takes place at above around 400° C. For nanomaterials, however, this can happen at around room temperature, most likely due to the higher surface energy. $SiO_2$ may be a barrier to lithium diffusion at room temperature, but likely ceases to be so at more elevated temperature. Therefore, multilayers terminated with $Si/SiO_2$ are most likely prone to reaction with lithium and not suitable for high-temperature MLM coatings in a lithium environment. One or several protective layers, however, with perhaps also additional thin reaction barrier/interdiffusion layers are needed as protection as discussed above.

It may be possible to use Mo alone as a single capping layer of, e.g., a Mo/Si MLM mirror. The Mo can oxidize, however, leading to about a 10–12% loss of reflectivity. The lithium may react with the molybdenum oxide and form $Li_2O$ or lithium molybate ($Li_2MoO_4$) which may also lead to a loss of reflectivity, but may also eventually lead to stable conditions under lithium exposure.

Applicants also consider a ruthenium capping layer as workable, since Ru caping layers have been used successfully before in other lithium environments. However, with Ru deposited directly on top of a Si layer, there is interdiffusion and a ruthenium silicide intermixing layer can be formed, which must be addressed in EUV MLM mirror applications. In order to prevent this, the LLNL group has suggested putting a thin $B_4C$ layer below the Ru capping layer. The Ru layer has the advantage that it is oxidation resistant. However, there can be diffusion of the lithium into (and perhaps through) the ruthenium layer, at least there are studies for Li diffusion with single-crystal Ru surfaces, that suggest this is true. At 13.5 nm, ruthenium is almost as transparent as molybdenum, but not quite.

There are other transition metals as candidates for capping layer. Rh and Pd have less tendency for oxidation but absorb the 13.5 nm radiation more strongly. Nb and Zr will form an oxide layers but the elements themselves are more transparent. The EUV transparency increases as one goes through the periodic table from Zr to Y to Sr to Rb. However, elemental Rb is not the best choice, as it is relatively more reactive with, e.g., lithium, and also melts at low temperatures. Compounds of Rb, however, e.g., RbCl could perhaps be considered. Mo/Sr multilayer coatings have been tested by Montcalm et al from LLNL with not very encouraging results. The reflectivity decreased strongly after exposure to air, even when a protective carbon coating was applied. Due to their relatively high 13.5 nm EUV transparency, zirconium compounds. e.g., ZrC or $ZrB_2$ are good candidates, at least for thin barrier layers to protect lower layers and to prevent Li diffusion.

Yttrium and yttrium compounds seem to be very promising for use in aplications according to aspects of an embodiment of the present invention). Mo/Y have been made successfully by S. Baijt et al. from the LLNL group after they obtained good sputter targets and had better UHV magnetron-sputtering conditions. They made and studied these multilayers for the region of 7–12 nm, mainly at around 11.5 nm. Mo/Y MLMs are good in the fairly broad region from 6–15 nm (at least theoretically), but they do not reach the reflectivity of Mo/Si in the 12.4–15 nm range. Mo as the top layer has been found to be better than yttrium on top, and also better than a Pd capping layer, in the cases studied (for 11.5 nm MLM). If at the top, the yttrium layer apparently oxidizes completely, and perhaps some of the Mo below. The oxide background of the vacuum system during deposition and the oxide contend of the yttrium is very important for the achieved reflectivity. After annealing at elevated temperatures, e.g., 250, 380 and 480° C. there was better contrast in TEM results between the Mo and Y layers, but the reflectivity was only stable to 250° C. for the system studied. The sputter target with somewhat higher oxygen contend provided higher EUV reflectivity than the Mo/Y MLM with very low oxygen containing yttrium. The oxygen could have had a smoothening effect. According to aspects of an embodiment of the present invention applicants believe that very oxygen-free yttrium used as sputter target will result in only a thin (about 2 nm thick) $Y_2O_3$ layer being formed and the yttrium below will not be attacked since it is relatively oxygen-free. This may also lead to better high-temperature stability with more oxygen-free yttrium layers (oxygen-free sputter target).

Other useful information comes from the fusion community. There an insulating lithium-resistant coating is needed to separate the hot liquid lithium from the vanadium alloy wall, and oxide layers used in this context include: $Al_2O_3$, MgO, AlN, BN, CaO, $Y_2O_3$, BeO, $Er_2O_3$, $Sc_2O_3$, CaZrO, YScO, $Si_3N_4$, $LiAlO_3$, $HfO_2$, $ZrO_2$ and others, some of which have been shown to be effective in such applications at elevated temperatures, e.g., above 500° C. and even up to 1000° C. CaO and AlN are leading high temperature candidates, but CaO layers may have some draw-backs for EUV MLM applications, e.g., mass losses at high temperature. $Y_2O_3$ and $Sc_2O_3$ seem to be the most stable oxides for hot lithium, e.g., yttria ($Y_2O_3$) may be the most thermodynamically stable with very little corrosion. Other possible oxides are $Er_2O_3$, $YScO_3$, and CaO. $SiO_2$, in contrast, is only marginally stable for Sn-25Li alloys, for example. Given the density the 13.5 nm transmittance of a single layer of, e.g., 1 nm in thickness can be calculated and, e.g., single-pass transmission for Si: 99.83%, for Y: 99.79%, for $Y_2O_3$: 98.97%, for $Sc_2O_3$: 98.23%, for $YB_6$: 99.64%, for CaO: 98.76%, to name some.) It is possible, that a $YLiO_2$ layer can form on the yttria.

Yttrium or yttrium compounds have good properties with respect to lithium and show little reaction. According to aspects of an embodiment of the present invention, applicants propose yttrium compounds, e.g., yttrium hexaboride for use as the thin intermediate layer for diffusion and intermixing deterrence in multilayer stacks. According to aspects of an embodiment of the present invention applicants also consider using a $Y_2O_3$ layer formed after exposure of yttrium to air as a capping layer. With respect to sputtering resistance by lithium ions, Y should be as good as similar transition metals and better than Si, for example.

According to aspects of an embodiment of the present invention applicants also consider coating a high-temperature multilayer (like $MoSi_2$/Si) with protective layers of Mo and Y, separated, for example, by thin barrier layers to provide temperature stability (e.g., through intermixing deterrence) and a diffusion barrier for lithium. Since Mo/Y is probably not stable at above 250° C., a barrier layer might be needed. Carbon or $B_4C$ may be used, although carbon may start to diffuse at higher temperatures. Other possible barrier layers include ZrC, $ZrB_2$, $YB_6$, $SiB_6$ and others. Since yttrium is a reasonably good spacer material with fairly high transmittance at 13.5 nm, it is well suited for applications in EUV collector/director and other reflective applications in a MLM stack.

According to aspects of an embodiment of the present invention capping layers have been considered for protection against a reactive source material, e.g., lithium. Oxidation has been considered, since some oxide layers are stable to Li at high temperatures, e.g., yttria, while some may not be. Both single protection layers and multilayer protective stacks have been proposed and the use of a $SiO_2$ terminated high-temperature multilayer mirror with a candidate material for a protective layer is proposed.

According to aspects of embodiments of the present invention applicants have disclosed and the appended claims relate to plasma generated EUV reflecting optics, e.g., MLMs, using, e.g., Si layers in the multilayer stack, e.g., as a single layer in a binary layer in the multilayer stack, e.g., stacked Mo/Si binary layers or as a w/n-type doped Si in place of the Si in, e.g., an Mo/Si stack to prevent diffusion of lithium into the Si layer and prevent silicide formation and intermixing of underlying barrier layers between the MO and Si layers dopant that forms a segregated layer at the surface to prevent diffusion.

Applicants have also disclosed and the appended claims relate to a plasma based EUV light source reflective element comprising an MLM comprising a protective capping layer comprising itself a relatively transparent bi-layer of a metal from Groups 3–9 with periodic number 5, e.g., Ru and a layer containing a compound of a reactive plasma source material, e.g., lithium, which may comprise an oxide of the compound, e.g., $LiNbO_3$, in place of, e.g., a plain metal, e.g., Ru top layer in a capping layer. The lithium containing layer will not be significantly impacted by Li attack. The metal and compound can form a binary capping layer with the right positioning, thickness pitch and absorber to spacer ratio and respective refractive indices to preserve the MLM period and phase shifting so that the loss in reflectivity of the MLM due to the binary capping layer is reduced if not eliminated. The materials of the layers of the binary capping layer may be chosen to be in phase equilibrium, e.g., due to the compound being stoiciometric and or the materials not being subject to substantial intermixing. According to aspects of an embodiment of the present invention applicants propose also to put a vacuum in between the binary capping layers of the MLM, e.g., between the Ru/$LiNbO_3$ binary capping layer and an underlying binary MLM layer, e.g., containing silicon, by, e.g., forming a grid (not shown) with the silicon and then the binary capping layer above that silicon layer as the binary or single capping layer(s), with measures taken to prevent a reactive plasma source material, e.g., lithium from going along the capping layer, the grid and vacuum serving to respectively separate the layers to allow formation of the vacuum, and prevent diffusion/interaction with a reactive source material, e.g., lithium.

According to aspects of an embodiment of the present invention applicants also propose and the appended claims relate to MLM that have, e.g., an MLM stack with, e.g., SiC layers of alternating density and maybe also doped for electrical conductivity, which will have good thermal stability to around 700° C. This material is stiff, has low thermal expansion coefficient and good thermal conductivity, with high density and melting temperature. The density regulates the index of refraction and thus the thicknesses of the respective different density layers to form the respective binary layer of the MLM stack. SiC may for, e.g., coarse material grains that are not small w/r/t the wavelength. This embodiment forms, e.g., material that is porous and have grain properties with the grain structure that is not dense or packed enough to create multiple reflecting surfaces. For less reactive plasma source materials, e.g., tin or indium, the diffusion problem may be significantly reduced, e.g., due in part to lower temperature operation and the lower reactivity. While Li will attack Si, it is not clear how well it attacks SiC. Furthermore, suitable capping, e.g., with a capping layer of Ru or Mo could be used to protect the mirror surface, along with other capping techniques discussed in the present application or otherwise in the prior art. Other advantages of a SiC dielectric multilayer stack mirror are: low thermal expansion coefficient, very stiff, rigid material, high thermal conductivity, high density (vacuum compatible), high melting temperature. Polishing of SiC is also possible as there are suppliers who can polish the material.

According to aspects of an embodiment of the present invention applicants propose to deposit alternately porous and dense SiC layers, e.g., via a CVD process to create the multilayer mirror stack stack. Alternatively it is possible to deposit dense SiC and electrochemically etch or otherwise form holes it. Porous SiC will have a higher n, where denser SiC will have a lower n. A refinement of the etch process could allow varying the electrochemical potential during SiC etching to produce, e.g., a 3-D pore structure. High current density etching will produce a more porous SiC.

A CVD process available from Trex is able to produce materials of laminar structure based on the Trex proprietary CVD process. By, e.g., periodically altering the SiC deposition chemistry in the reactor (, e.g., modifying the feed gasses) it is possible to generate a laminar ceramic of alternating density layers.

Another construction concept could involve changing the CVD process by mixing in different dopants at the proper times, which can serve to tune the refractive index and conductivity of the respective layer. Basically, the final mirror would still be SiC, but with a few ceramic dopants to adjust density and electrical conductivity. This concept should eliminate concerns regarding thermal damage of 13.5 nm radiation mirrors at elevated temperatures since diffusion of Si and SiC (self diffusion) in SiC is very slow. Thermal degradation is diffusion driven and observed in Mo/Si mirrors used at or over, e.g., 300° C.–500° C., since these materials are metallic in nature (not compounds). Interlayers can be used to improve Mo/Si mirrors, e.g., for >500° C. operation and may also prove useful for an SiC stack mirror.

A parabola shaped reflector could be made by deposition of alternating layers and then mounted to a flange. Since SiC can be conductive, one could heat, or DC/RF bias the collector for cleaning. An SiC multilayer stack mirror can be heated resistively. Since the material is rigid, one would expect it not to melt or soften at the desired 400° C.–500° C.+ operating temperature. According to aspects of an embodiment of the present invention applicants also propose to grow a bulk SiC mirror and have the SiC stack deposited onto it after polishing the mirror. A Ru or Mo capping layer on the SiC film could be used to prevent reaction with a reactive source material, e.g., lithium.

According to aspects of an embodiment of the present invention applicants propose and the appended claims relate to a plasma produced EUV light source MLM comprising, e.g., yttrium oxide along with molybdenum as a top capping binary layer for the underlying EUV MLM reflecting surfaces, which may also be Y/Mo binary layers or other binary layers. Alternatively applicants propose using Mo/Y binary layers for the entire stack of the MLM, e.g., using intermediate barrier layers to allow use of Mo/Y stacks for the entire reflective stack at up to 400–500° C. and above. Also Si based stacks can be coated with the binary capping layers of Mo, Y and perhaps also a diffusion barrier layers for the binary capping layer, with Y as the topmost layer, which may then also form a $Y_2O_3$ layer when exposed to air (both Y and $Y_2O_3$ being resistant to lithium) and sufficiently transparent to EUV at around 13.5 nm to be a spacer layer in a binary capping layer and/or throughout the MLM stack. The Mo/Y and/or Mo/Yttria binary layers can have, e.g., better thermal properties than MoSi MLM with perhaps some sacrifice in total reflectivity. Use of the MoSi in lower layers and the Yttrium mirror layers on the top can lessen the loss in reflectivity. Mo/Y layers are currently produceable with limited enough oxygen content to be useful for EUV MLMs. The Mo/Y based binary capping layers can be spread throughout the MLM to accommodate, e.g., the case that the top capping layer is destroyed. If lithium stays in the diffusion boundary layers of a respective binary layer there may be a resultant increase in reflectivity but also an increase the absorption of EUV. MLMs can tolerate some influx of lithium and still work, though lithium diffusion reduces the contrast because the absorption goes up and the spacing is modified with respect to the selected EUV λ and also diffusion of lithium into the intermediate barrier layer can changes the roughness, affecting reflectivity and thermal stability. A spacer already containing lithium, however, can tolerate more diffusion with less damage to mirror properties. The list of materials that may be used according to this embodiment of the present invention as such barrier layers includes fluorides like MgF, LiF SiOF, oxides, like $Er_2O_3$, $HFO_2$, $Ta_2O_5$, refractory metal oxides, rare earth metal fluorides, nitrides and oxides, e.g., at nm thicknesses, chromium fluorides, nitrides and oxides and silicides.

According to aspects of an embodiment of the present invention applicants have disclosed and the appended claims relate to the following:

Protective layer consisting of yttrium (or yttrium-zirconium alloy) with native yttria oxide (or yttrium-zirconia) layer on top to prevent diffusion/intercalation/penetration of lithium and to protect the lower (high-temperature) multilayer mirror coating from lithium. Another good combination may be a protective layer consisting of a bilayer with (e.g. ca. 3 nm thick) ruthenium as top overcoat layer and (e.g. ca. 4 nm thick) yttrium as bottom overcoat layer. (Or Ru—Mo alloy as top overcoat layer or Mo covered by Ru as top overcoat layer above a yttrium (or yttrium-zirconium alloy) bottom overcoat layer.

According to aspects of an embodiment of the present invention applicants have disclosed and the appended claims relate to a $SiO_2$ doped with N or reactively sputtered in a $N_2$ environment to create a silicon oxy-nitride diffusion barrier layer.

According to aspects of an embodiment of the present invention, applicants have disclosed and the appended claims relate to heating the substrate during MLM stack layer deposition to increase the mobility of the atoms being deposited in the layer to decrease upper surface roughness, which ultimately leads to better temperature stability in the multilayer stack. The layer produced is also enhanced due to increased density of the deposition. This could allow for enhanced utilization with better reflectivity up to about 600° C. There is also a resultant decrease of the surface roughness which promotes interface barrier function and increases reflectivity. Heating with normal Mo/Si can produce more intermixing at elevated temperatures but with layer less prone to intermixing, e.g., $MoSi_2/Si$, $Mo_2C/Si$, Mo/SiC, $Mo/SiB_6$ and also with barrier layers in between Mo/X/Si/X where X is C, SiC, Si nitrides and Si oxynitrides and borides and boronitrides there may be less intermixing with the heating during deposition. This may also apply, e.g, with Y and its compounds, nitrides, borides carbides and oxynitrides are good diffusion barriers and have low reflectivity and low absorption in very thin layers. These materials may be formed, e.g., by doping $SiO_2$ as it is being formed by oxidation od silicon, with nitrogen, boron or boron nitride.

According to aspects of an embodiment of the present invention, the applicants have disclosed and the appended claims relate to the use of a sandwiched $Mo_5Si_3$ main absorber layer with $MoSi_2$ sandwiching layers in a $MoSi_2$—$Mo_5Si_3$—$MoSi_2$—Si MLM stack to increase the amount of Mo in the main absorber layer (Si is the spacer layer) for better EUV reflectivity and also maintaining layers that are in phase equilibrium with each other bordering each other so as to enhance high temperature stability by avoiding boundary intermixing up to about 700° C.

According to aspects of an embodiment of the present invention applicants have disclosed and the appended claims relate to a multilayer stack of Mo—Ru and Y—Zr alloy layers with or without a barrier layer which barrier layer may be ZrN or other nitrides carbides or borides and with either the ZrN or other nitrides or carbides or borides or Y—Zr as the topmost layer of the capping binary layer and if ZrN is the topmost layer with the Mo—Ru absorber layer of the underlying binary layer as the interface to the capping layer. Also the diffusion barrier layers may be amorphous, e.g., to reduce lithium diffusion. The Y—Zr spacer alloy, yttrium stabilized zerconium can act as a very good stabilizer barrier layer.

Applicants have also proposed the use of $MgF_2$ or LiF as a lithium diffusion and MLM halogen etching barrier capping layer as an improvement over Ruthenium. As noted in the above referenced co-pending patent applications assigned to the common assignee of the present applications various debris management tactics are available for protection of the EUV source chamber collector optics, e.g., reflectors, which can subject, e.g., an MLM collector to harsh environments, one example of which is the used of halogen contained in the chamber to etch plasma formed debris, e.g., debris source material or perhaps more importantly compounds of debris source materials and like compounds that may be more difficult to remove by other mentioned techniques for this reason applicants propose capping layers for an MLM that can both resist plasma source material diffusion and also resist etching by an etchant, e.g., a halogen used to etch plasma debris from the MLM outer capping layer as noted these may include halogen containing coatings, e.g., fluorine containing coatings, e.g., $MgF_2$ or LiF.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. In additions to changes and modifications to the disclosed and claimed aspects of embodiments of the present invention(s) noted above the following could be implemented. By in large binary layers, whether described in the present application as capping layers or stack layers or periodic binary diffusion blocking layers as selected of materials having the appropriate properties for constituting MLM layers and particularly absorber and spacer layers in combination and applicants have provided some exemplary dimensions, however, those skilled in the art will understand that the dimensions, e.g., thicknesses may vary and will understand how to appropriately determine such dimensions for appropriate reflectivity and also that the reflectivities may well be understood to be achievable for target center wavelengths in the EUV range other than for 13.5 nm. These may vary as well for the same materials, e.g., depending on the manner of deposition of the coatings forming the various layers, e.g., in ways noted above that impact density of the material in the deposited layer, and other ways in which the index of refraction might be modified, including changing dopants, changing crystal structure, e.g., from amorphous to crystalline, etc. Those skilled in the art will also know that, as mentioned herein, often times when a particular material is mentioned as useful as an example of a material for a layer in an MLM, compounds and alloys of the material will be understood by those skilled in the art to often posses the same or similar enough properties for EUV source chamber reflective optic multilayer reflectors and also therefore be substitutes for the material specifically disclosed or recited in an appended claim. It will also be understood that binary layer as used in the present application including in the appended claims, as explained above with regard to aspects of at least one embodiment, is intended to cover, where appropriate, as will be understood by those skilled in the art, to cover "sandwiched" and other multiple layers as components of a binary layer, e.g., the sandwiched absorber layer discussed above used, e.g., to take advantage of better interface phase equilibrium as discussed above.

We claim:

1. A plasma generated EUV light source reflecting element comprising:
   a multilayer stack comprising at least one binary layer in the multilayer stack comprising a first material doped with a second material.
2. The apparatus of claim 1 further comprising:
   the first material comprises a dielectric material.
3. The apparatus of claim 1 further comprising:
   the at least one layer comprises a spacer layer.
4. The apparatus of claim 2 further comprising:
   the at least one layer comprises a spacer layer.
5. The apparatus of claim 1 further comprising:
   the first material comprises silicon.
6. The apparatus of claim 5 further comprising:
   the second material comprises an n-type dopant.
7. The apparatus of claim 6 further comprising:
   at least one layer in the at least one binary layer is a combination comprising silicon.
8. A plasma generated EUV light source reflecting element comprising:
   a multilayer mirror stack comprising:
   a capping layer comprising a binary capping layer comprising a first layer comprising an EUV transparent metal and a second layer comprising an EUV absorbing material comprising a compound of a reactive EUV plasma source material.
9. The apparatus of claim 8 further comprising:
   the reactive EUV plasma material comprises lithium.
10. The apparatus of claim 9 further comprising:
    the compound comprising at least one of the group 3–9 periodic number 5 metals.
11. The apparatus of claim 10 further comprising:
    the compound comprising an oxide of the compound.
12. The apparatus of claim 11 further comprising:
    the compound comprising $LiNbO_3$.
13. The apparatus of claim 12 further comprising:
    the first layer comprises a spacer layer and the second layer comprises an absorber layer in the binary capping layer.
14. The apparatus of claim 13 further comprising:
    the second layer comprises a top layer.
15. The apparatus of claim 14 further comprising;
    a vacuum containing layer between the binary capping layer and the remainder of the multilayer stack.
16. A plasma generated EUV light source reflecting element comprising:
    a multilayer mirror stack comprising a first layer of a material forming an absorber layer and a second layer of the material forming a spacer layer, the first layer being of a different density than the second layer.
17. The apparatus of claim 16 further comprising:
    at least one of the first and second layer being doped to improve electrical conductivity.
18. The apparatus of claim 17 further comprising:
    the material is a compound of silicon.
19. The apparatus of claim 18 further comprising:
    the material comprises a combination of Si and C.
20. The apparatus of claim 19 further comprising:
    the material comprises SiC.
21. A plasma generated EUV light source reflecting element comprising:
    a multilayer mirror stack comprising a binary capping layer comprising a Mo absorber layer and a spacer layer comprising yttrium.

22. The apparatus of claim 21 further comprising:
the spacer layer comprising a compound of yttrium.

23. The apparatus of claim 21 comprising:
the spacer layer comprising yttria.

24. The apparatus of claim 23 further comprising:
the multilayer mirror stack comprising a plurality of binary layers comprising the same materials as the binary capping layer.

25. The apparatus of claim 24 further comprising:
the multilayer mirror stack comprising a plurality of binary layers comprising at least one different material from the binary capping layer.

26. The apparatus of claim 25 further comprising:
the at least one material comprises silicon.

27. The apparatus of claim 26 further comprising:
the multilayer mirror stack comprises a combination of at least one other binary layer comprising the same materials as the binary capping layer and at least one other binary layer comprising at least one different material from the binary capping layer.

28. The apparatus of claim 27 further comprising:
at least one intermediate diffusion barrier layer intermediate a first layer in a binary layer and a second layer in a binary layer.

29. The apparatus of claim 28 further comprising:
the intermediate diffusion barrier layer comprises a fluoride or an oxide.

30. The apparatus of claim 29 further comprising:
the intermediate layer comprises a material selected from the group consisting of rare earth metal fluorides, nitrides and oxides, refractory metal fluorides, nitrides and oxides, other nitrides, borides and silicides.

31. A plasma generated EUV light source reflecting element comprising:
a multilayer mirror stack comprising a capping layer comprising a yttrium-zirconimum alloy or a yttrium-zirconia alloy.

32. The apparatus of claim 31 further comprising:
the capping layer comprising a binary capping layer comprising a metallic absorbing layer.

33. The apparatus of claim 32 further comprising:
the metallic absorbing layer comprising Ru.

34. The apparatus of claim 32 further comprising:
a binary capping layer comprising the yttrium-zirconimum or yttrium-zirconia layer underneath a top coating layer comprising Ru.

35. The apparatus of claim 33 further comprising;
the top coating layer comprising a Ru alloy.

36. The apparatus of claim 33 further comprising:
the Ru alloy comprising Ru—Mo.

37. A plasma generated EUV light source reflecting element comprising:
a silicon oxynitride diffusion barrier layer.

38. The apparatus of claim 37 further comprising:
the silicon oxynitride layer is formed by doping a $SiO_2$ layer with N or by reactively sputtering a $SiO_2$ layer in a nitrogen environment.

39. The apparatus of claim 38 further comprising:
the diffusion barrier layer comprises a capping layer.

40. The apparatus of claim 39 further comprising:
the diffusion barrier layer comprises a part of a binary capping layer.

41. A method for making a plasma generated EUV tight source reflecting element comprising:
heating the substrate during multilayer mirror stack layer deposition to increase the mobility of the atoms being deposited in the layer and decrease the upper surface roughness.

42. The method of claim 41 further comprising:
the heating step also accomplishes increasing the density of the layer.

43. A plasma generated EUV light source reflecting element comprising:
a plurality of binary layers comprising an absorber layer comprising a sandwiched absorber layer comprising a first compound of an absorber material intermediate a first sandwiching absorber layer comprising a second compound of the absorber material and a second sandwiching absorber layer comprising a third compound of the absorber material.

44. The apparatus of claim 43 further comprising:
the second compound of the absorber material is the same as the third compound of the absorber material.

45. The apparatus of claim 44 further comprising:
the interface of the first compound and the second compound is in phase equilibrium and the interface of the first compound with the third compound is in phase equilibrium.

46. The apparatus of claim 45 further comprising:
the first compound contains a higher percentage of an absorber material component responsible for the absorber characterization of the first compound than does the second compound or the third compound.

47. The apparatus of claim 46 further comprising:
the first compound is a first metal silicide and at least one of the second and third compound is a second metal suicide.

48. The apparatus of claim 47 further comprising:
the first compound is $Mo_5Si_3$ and the second and third compounds are $MoSi_2$.

49. The apparatus of claim 48 further comprising:
the binary layer comprising a spacer layer comprising a material the interface of which with the second and third material is in phase equilibrium.

50. A plasma produced EUV light source reflector element comprising:
a multilayer mirror stack comprising a plurality of binary layers each comprising a spacer layer comprising a spacer material alloy or an absorber layer comprising an absorber material alloy.

51. The apparatus of claim 50 further comprising:
an intermediate barrier layer between each spacer layer and absorber layer.

52. The apparatus of claim 51 further comprising;
the spacer material alloy comprises Y—Zr and the absorber material layer comprises Mo—Ru.

53. The apparatus of claim 52 further comprising:
an intermediate barrier layer comprising a material selected from the group consisting of borides, nitrides and carbides.

54. The apparatus of claim 53 further comprising:
a binary capping layer comprising the same materials as the spacer layer and the absorber layer and with the top layer comprising a spacer layer.

55. The apparatus of claim 54 further comprising:
the barrier layer comprises an amorphous material.

56. A plasma produced EUV light source reflector element comprising:
- a multilayer mirror stack comprising a plurality of binary layers each comprising a spacer layer comprising a spacer material alloy and an absorber layer comprising an absorber material alloy; and
- a top diffusion barrier layer comprising a material selected from the group comprising nitrides, borides and carbides; and
- the top diffusion layer lying on top of the absorber material alloy.

57. A plasma produced EUV light source reflector element comprising:
- a multilayer mirror stack comprising a plurality of binary layers and a capping layer comprising a lithium diffusion barrier layer or a halogen etching barrier layer.

58. The apparatus of claim 57 further comprising:
the capping layer comprising a material containing fluorine.

59. The apparatus of claim 58 further comprising;
the barrier layer comprising $MgF_2$ or LiF.

60. A plasma generated EUV light source reflecting element comprising:
- a dual binary capping layer comprising first binary capping layer comprising a spacer layer comprising a first spacer layer material overlying an absorber layer comprising a first absorber layer material, and a second binary capping layer comprising a spacer layer comprising a second spacer layer material overlying an absorber layer comprising a second absorber layer material.

61. The apparatus of claim 60 further comprising:
the first absorber material is the same as the second absorber material and the first spacer material is different from the second spacer material.

62. The apparatus of claim 61 further comprising:
the dual binary capping layer is repeated substantially throughout the entire reflecting element to form underlying dual binary stack layers beneath the dual binary capping layer.

63. The apparatus of claim 62 further comprising:
successive underlying dual binary stack layers forming a dual binary capping layer upon the deterioration of an overlying dual binary capping layer comprising an originally dual binary capping layer or an immediately overlying dual binary stack layer currently forming the dual binary capping layer.

64. The apparatus of claim 63 further comprising:
the first spacer layer comprises yttrium.

65. The apparatus of claim 64 further comprising:
the first spacer layer comprises yttrium.

66. The apparatus of claim 65 further comprising:
the first and second absorber material comprises Mo.

67. The apparatus of claim 66 further comprising:
the second spacer material comprises Si.

68. A plasma generated EUV light source reflecting element comprising:
- a binary capping layer comprising a spacer layer comprising an absorber comprising a first absorber layer material overlying a spacer layer comprising a first spacer layer material;
- a plurality of regular binary stack layers comprising a second absorber layer comprising a second absorber material underlying the binary capping layer and a spacer layer comprising a second spacer material; and,
- dispersed among the plurality of binary stack layers a dispersed binary stack layer comprising the first absorber material and the first spacer material.

69. The apparatus of claim 68 further comprising:
the dispersed binary stack layers are periodically dispersed.

70. The apparatus of claim 69 further comprising:
the plurality of regular stack layers comprising an intermediate intermixing boundary layer.

71. The apparatus of claim 70 further comprising:
the first absorber material comprises Mo and the first spacer material comprising Y.

72. The apparatus of claim 71 further comprising:
the second absorber material comprises Mo and the second spacer material comprises a silicon compound.

73. The apparatus of claim 72 further comprising:
the silicon compound is SiC.

74. A method of forming a plasma generated EUV light source reflecting element comprising:
providing a multilayer stack comprising at least one binary layer in the multilayer stack comprising a first material and doping the first material with a second material.

* * * * *